United States Patent [19]
Khan

[11] Patent Number: 5,905,673
[45] Date of Patent: *May 18, 1999

[54] INTEGRATED CIRCUIT FOR STORAGE AND RETRIEVAL OF MULTIPLE DIGITAL BITS PER NONVOLATILE MEMORY CELL

[75] Inventor: Sakhawat M. Khan, Sunnyvale, Calif.

[73] Assignee: Agate Semiconductor, Inc., Santa Clara, Calif.

[*] Notice: This patent is subject to a terminal disclaimer.

[21] Appl. No.: 08/867,350

[22] Filed: Jun. 2, 1997

Related U.S. Application Data

[63] Continuation of application No. 08/540,117, Oct. 6, 1995, Pat. No. 5,687,114.

[51] Int. Cl.⁶ .................................................... G11C 11/34
[52] U.S. Cl. .............................. 365/185.03; 365/185.33
[58] Field of Search ..................... 385/185.33, 230.03, 385/189.05, 185.03

[56] References Cited

U.S. PATENT DOCUMENTS

| | | | |
|---|---|---|---|
| 4,054,864 | 10/1977 | Audaire et al. | 340/173 R |
| 4,181,980 | 1/1980 | McCoy | 365/45 |
| 4,415,992 | 11/1983 | Adlhoch | 365/94 |
| 4,448,400 | 5/1984 | Harari | 365/185 |
| 4,612,629 | 9/1986 | Harari | 365/185 |
| 4,627,027 | 12/1986 | Rai et al. | 365/45 |
| 4,667,217 | 5/1987 | Janning | 357/54 |
| 4,890,259 | 12/1989 | Simko | 365/45 |
| 4,989,179 | 1/1991 | Simko | 365/45 |
| 5,043,940 | 8/1991 | Harari | 365/168 |
| 5,150,327 | 9/1992 | Matsushima et al. | 365/189.01 |
| 5,172,338 | 12/1992 | Mehrotra et al. | 365/185 |
| 5,218,569 | 6/1993 | Banks | 365/189.01 |
| 5,220,531 | 6/1993 | Blyth et al. | 365/189.07 |
| 5,222,047 | 6/1993 | Matsuda et al. | 365/230.03 |
| 5,241,494 | 8/1993 | Blyth et al. | 365/45 |
| 5,243,239 | 9/1993 | Khan et al. | 307/521 |

(List continued on next page.)

FOREIGN PATENT DOCUMENTS

WO 90/12400  10/1990  WIPO .............................. G11C 7/00

OTHER PUBLICATIONS

Alberts et al., "Multi–Bit Storage FET EAROM Cell," *IBM Tech. Disclosure Bulletin* (1981) 24:3311–3314.

"Japanese develop nondestructive analog semiconductor memory," *Electronics*, Jul. 11, 1974, pp. 29–30.

Bleiker et al., "A Four–State EEPROM Using Floating–Gate Memory Cells," *IEEE J. Solid–State Circuits* (1987) SC–22:357–360.

Horiguchi et al., "An Experimental Large–Capacity Semiconductor File Memory Using 16–Levels/Cell Storage," *IEEE J. Solid–State Circuits* (1988) 23:27–33.

Furuyama et al., "An experimental 2–bit/cell storage DRAM for macro cell or memory–on–logic application," *IEEE 1988 Custom Integrated Circuits Conference*, pp. 4.4.1–4.4.4.

Blyth et al., "A Non–Volatile Analog Storage Device Using EEPROM Technology," *1991 IEEE International Solid–State Circuits Conference*, pp. 192–193 & 315.

(List continued on next page.)

*Primary Examiner*—David Nelms
*Assistant Examiner*—M. Tran
*Attorney, Agent, or Firm*—Townsend and Townsend and Crew LLP

[57] ABSTRACT

An integrated circuit storing multiple bits per memory cell is described. The amount of charge stored in a memory cell corresponds the multiple bits in a memory cell. Dual banks of shift registers are alternately coupled to one or more data pins and to the memory cells of the memory array speed data transfer for reading and writing operation. Reading is performed in the voltage mode to conserve power. During writing operations, reading of a memory cell is performed in the voltage mode to determine whether the desired programming of the memory cell has been achieved. During the reading of a memory cell, the voltage corresponding to the amount of charge stored in a memory cell is compared against a binary search sequence of reference voltages to determine the multiple bits stored in the memory cell.

33 Claims, 12 Drawing Sheets

U.S. PATENT DOCUMENTS

| | | | |
|---|---|---|---|
| 5,294,819 | 3/1994 | Simko | 257/314 |
| 5,336,936 | 8/1994 | Allen et al. | 307/201 |
| 5,352,934 | 10/1994 | Khan | 307/296.1 |
| 5,388,064 | 2/1995 | Khan | 365/45 |
| 5,394,362 | 2/1995 | Banks | 365/189.01 |
| 5,412,601 | 5/1995 | Sawada et al. | 365/185 |
| 5,422,842 | 6/1995 | Cernea et al. | 365/185 |
| 5,440,518 | 8/1995 | Hazani | 365/218 |
| 5,485,422 | 1/1996 | Bauer et al. | 365/168 |
| 5,508,958 | 4/1996 | Fazio et al. | 365/185.19 |
| 5,521,865 | 5/1996 | Ohuchi et al. | 365/185.03 |
| 5,521,878 | 5/1996 | Ohtani et al. | 365/189.05 |
| 5,523,972 | 6/1996 | Rashid et al. | 365/185.22 |
| 5,539,690 | 7/1996 | Talreja et al. | 365/185.22 |
| 5,546,341 | 8/1996 | Suh et al. | 365/185.33 |

OTHER PUBLICATIONS

Goodenough, "IC Holds 16 Seconds of Audio Without Power," *Electronic Design,* Jan. 31, 1991, pp. 39–44.

Horio et al., "Analog Memories for VLSI Neurocomputing," *Analog Memory,* Paper 2.21, pp. 344–363.

Ria et al., "Neuron–MOS Multiple–Valued Memory Technology for Intelligent Data Processing," *1994 IEEE International Solid–State Circuits Conference,* pp. 270–271 & 351.

Bauer et al., "A Multilevel–Cell 32Mb Flash Memory," *1995 IEEE International Solid–State Circuits Conference* pp. 132–133 & 351.

Shirota et al., "A New Programming Method and Cell Architecture and for Multi–Level NAND Flash Memories," *The 14th Annual IEEE Nonvolatile Semiconductor Memory Workshop,* Paper No. 2.7.

Heald et al., "Multilevel Random–Access Memory Using One Transistor Per Cell," *IEEE J. Solid–State Circuits* (1976) SC–11:519–528.

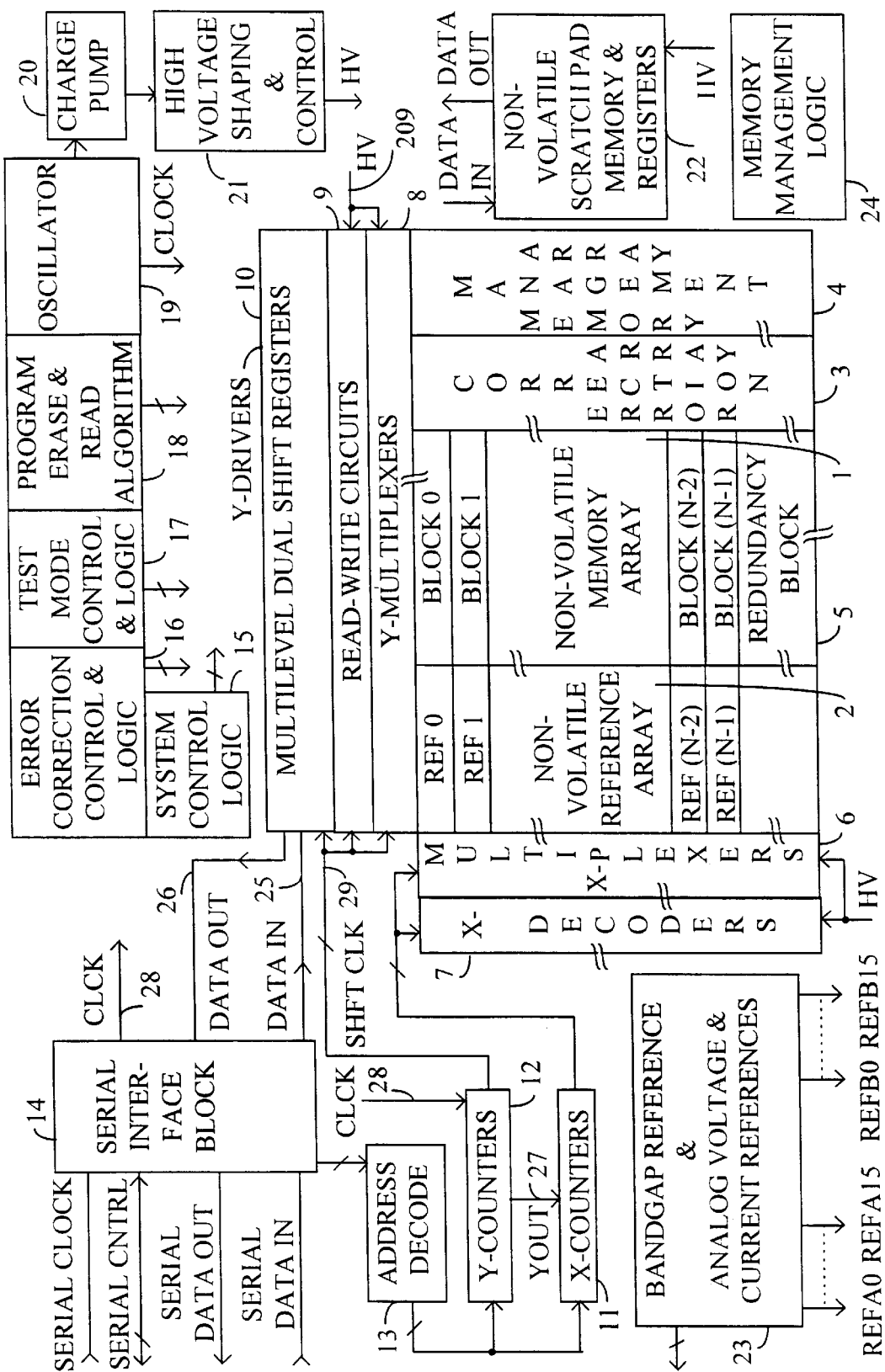
FIG._1

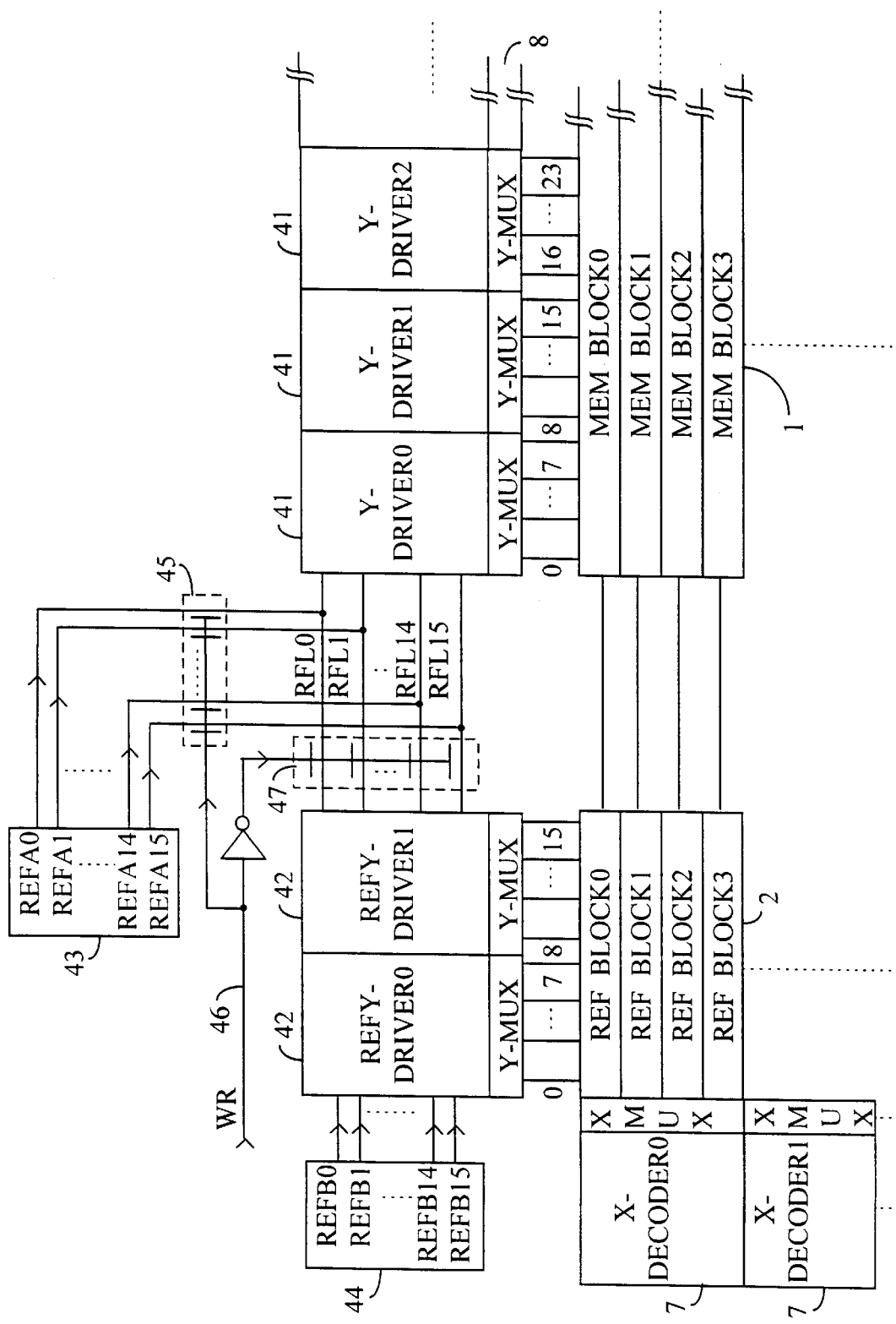
FIG._3

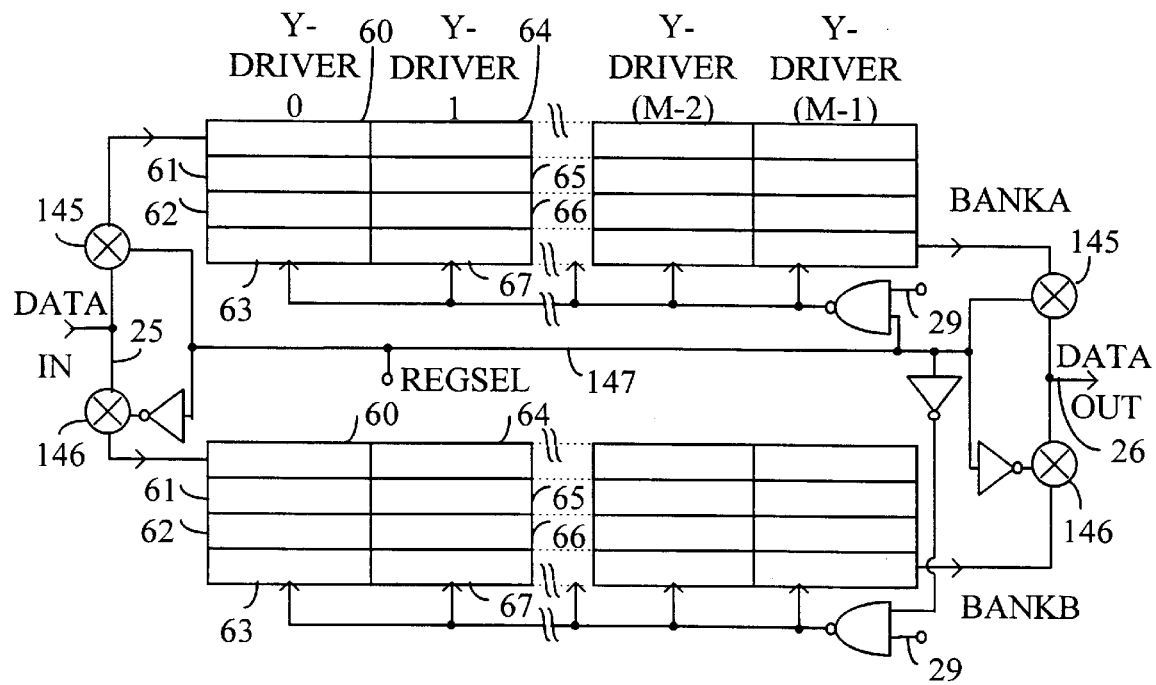
FIG._4
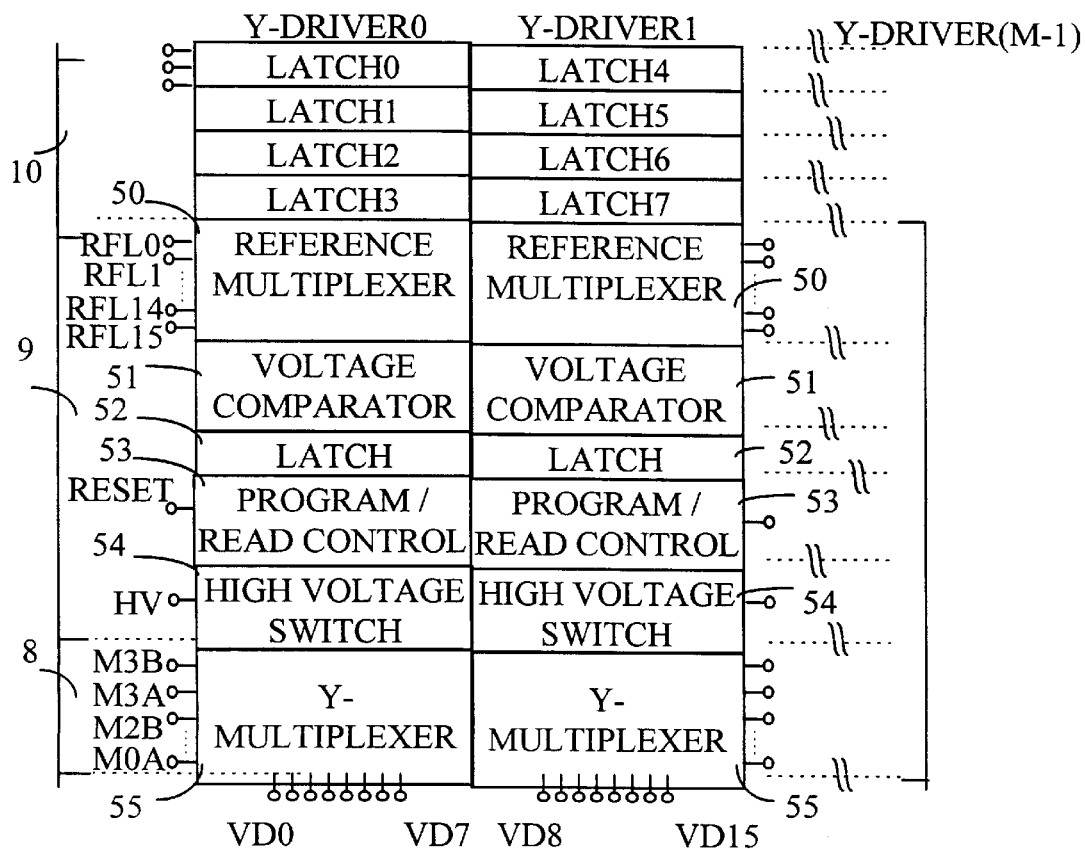
FIG._5

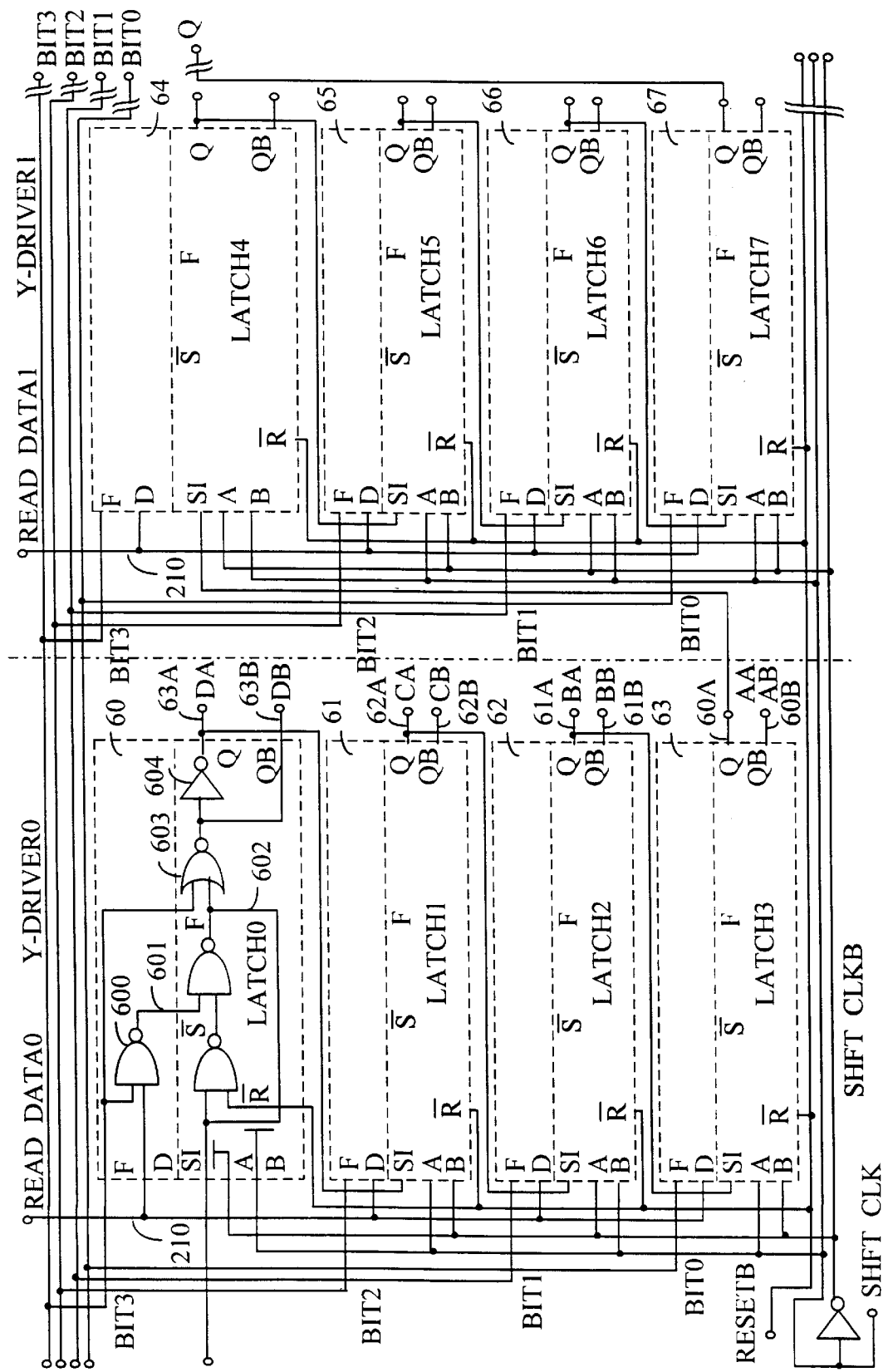
FIG._6

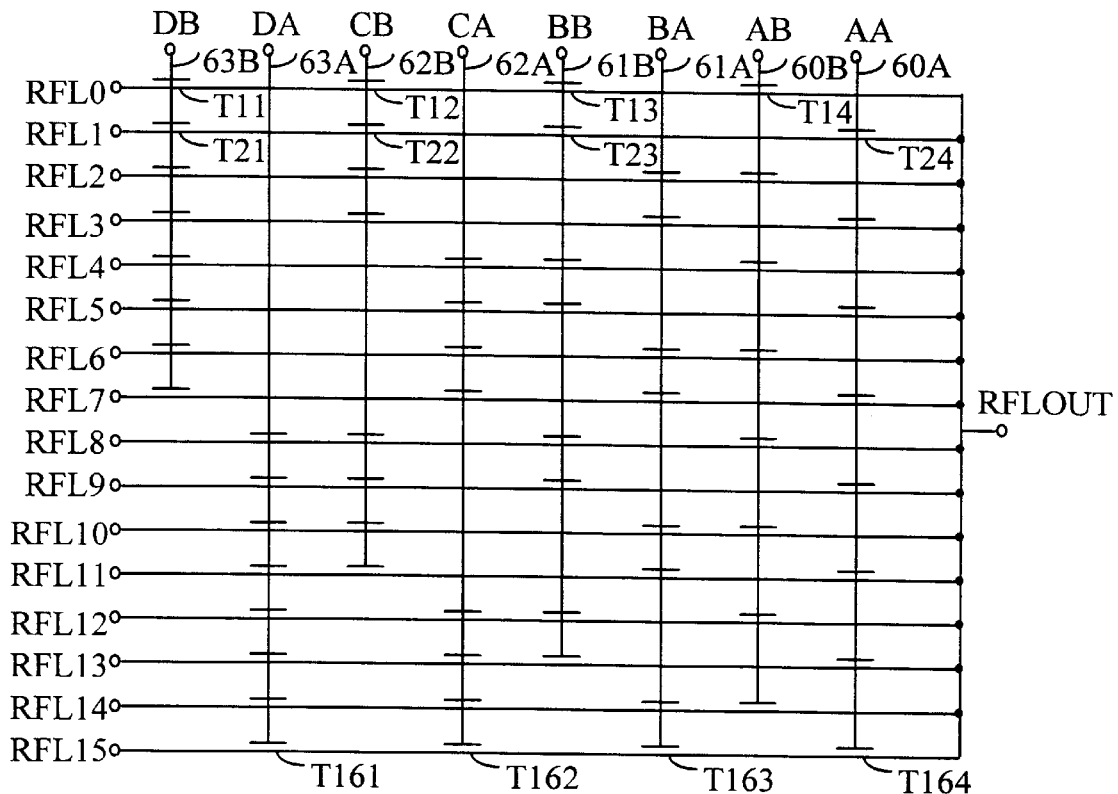
FIG._7
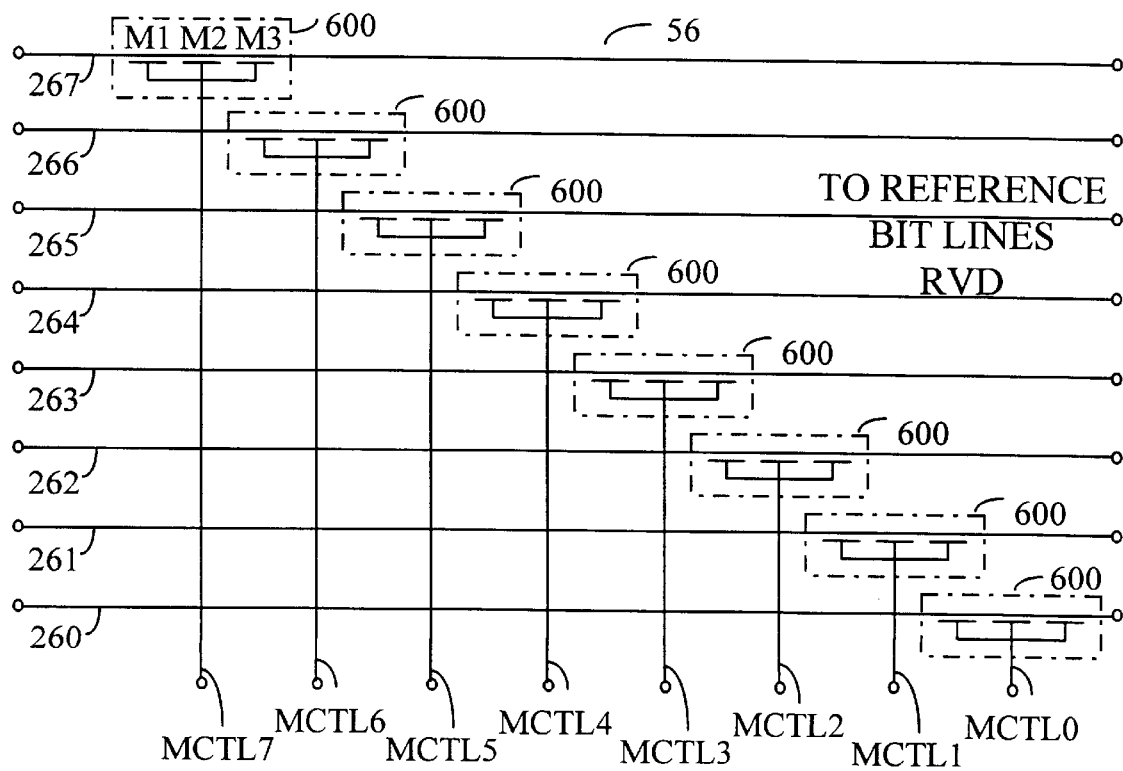
FIG._8C

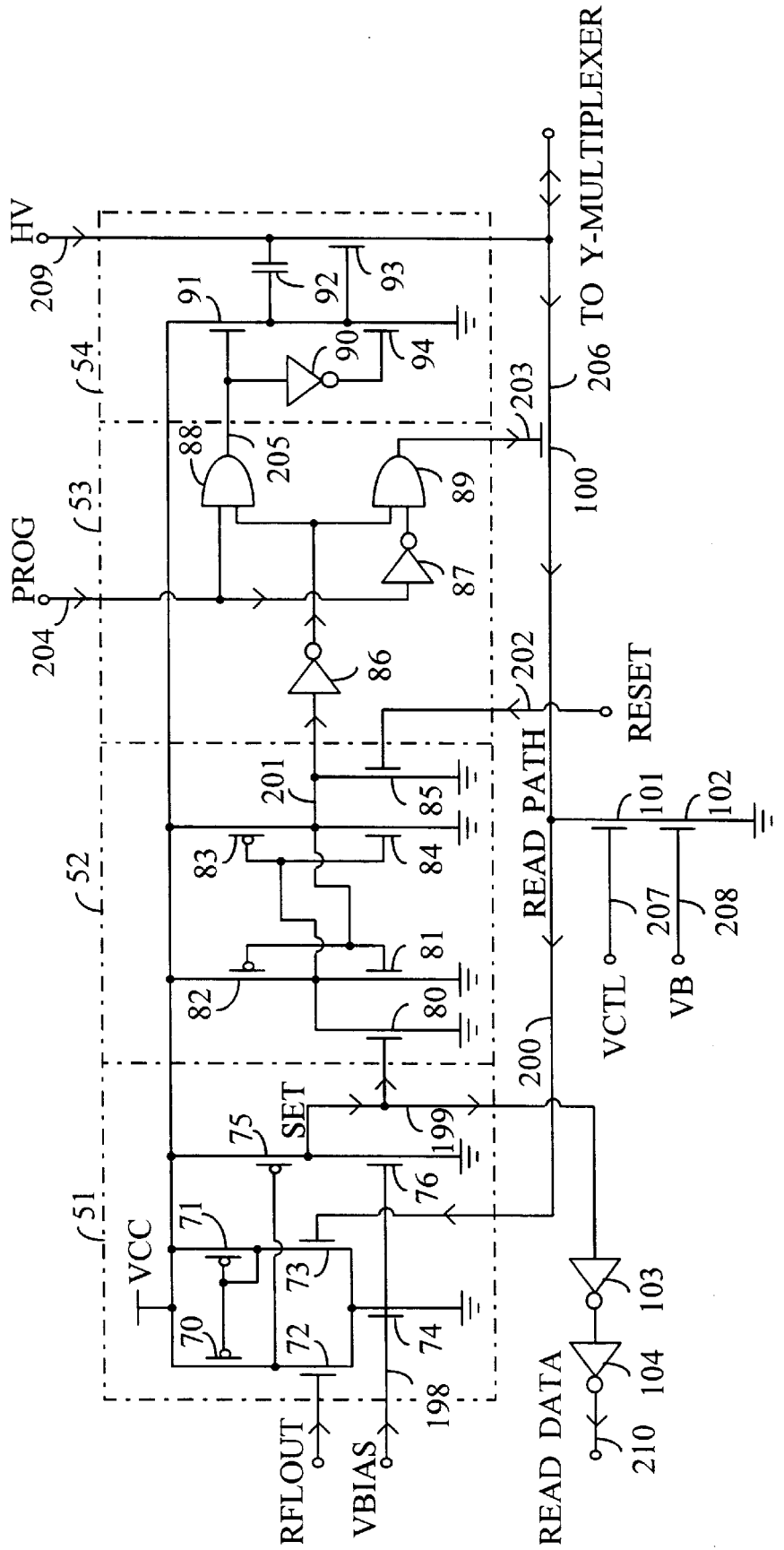
FIG._8A

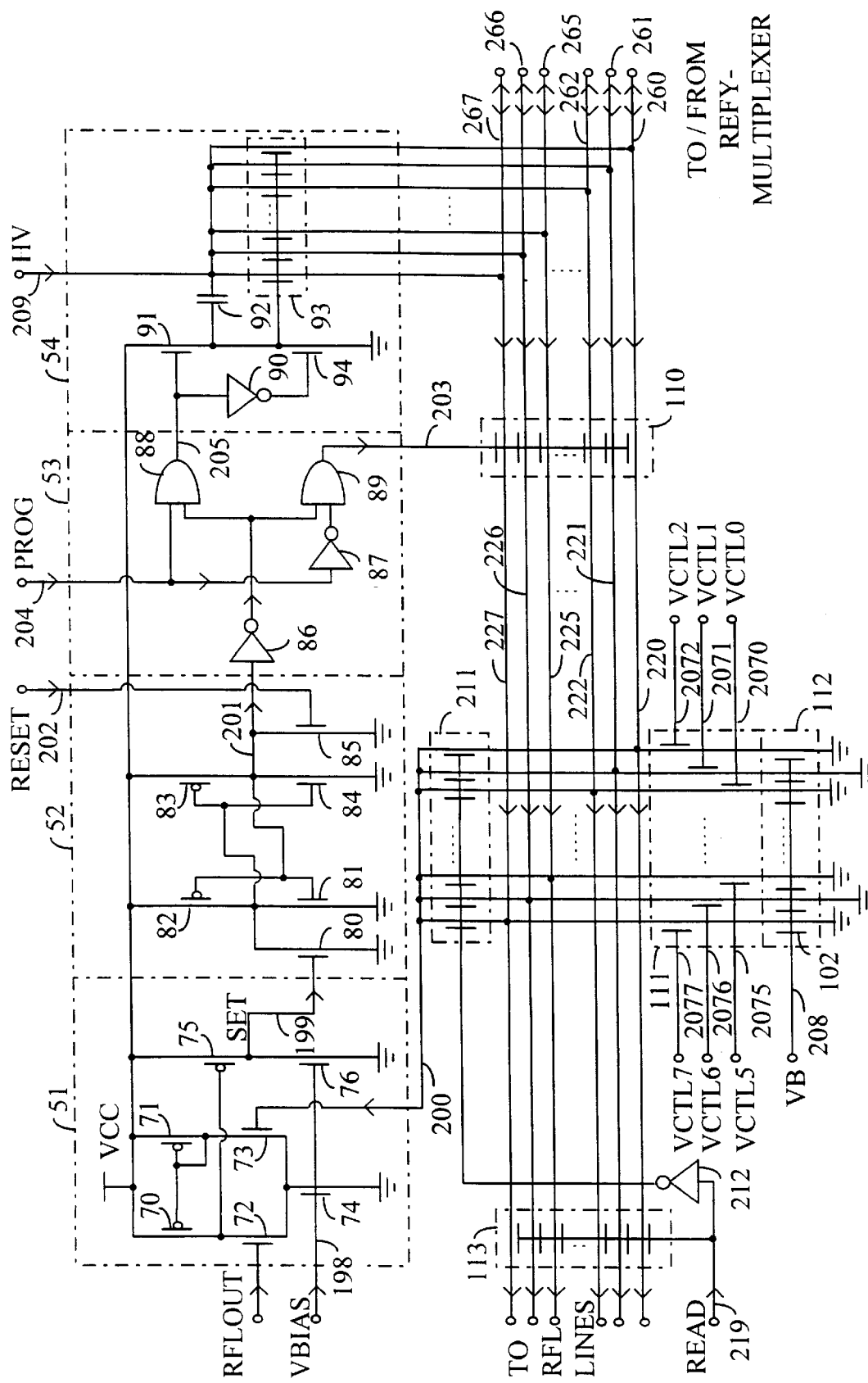
FIG._8B

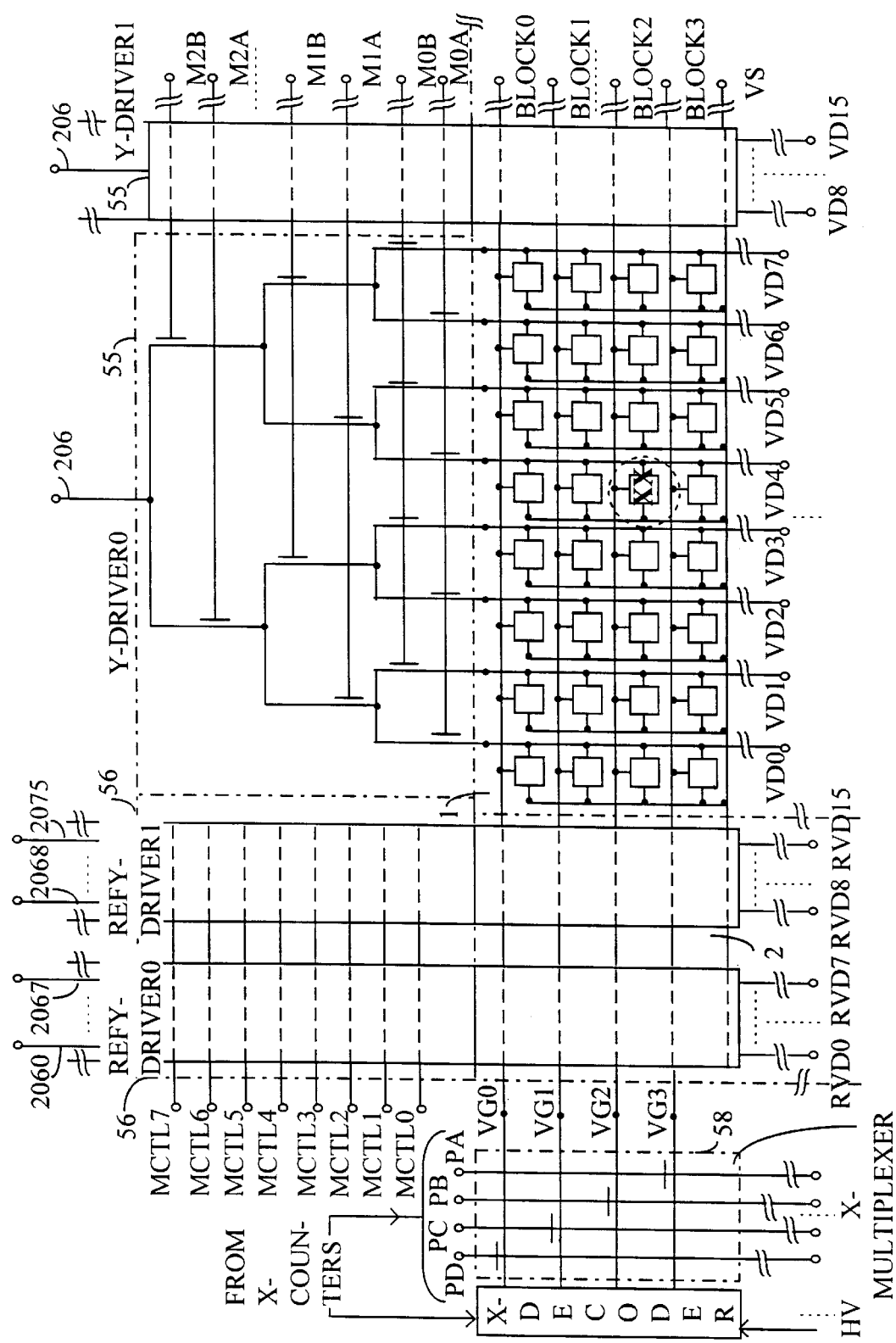
FIG._9A

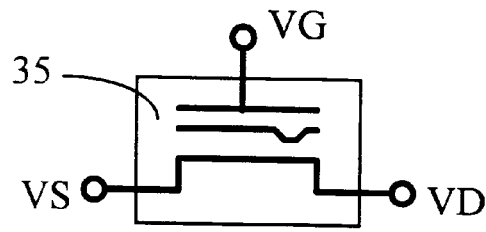
*FIG._9B*
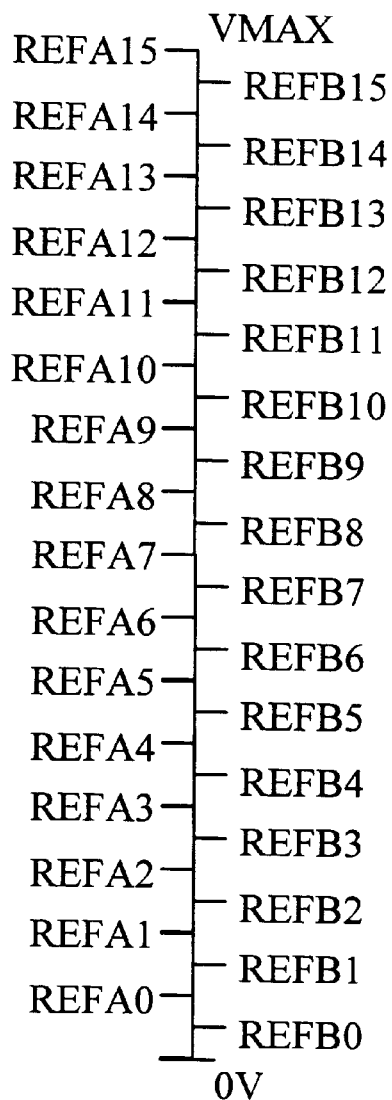
*FIG._10*

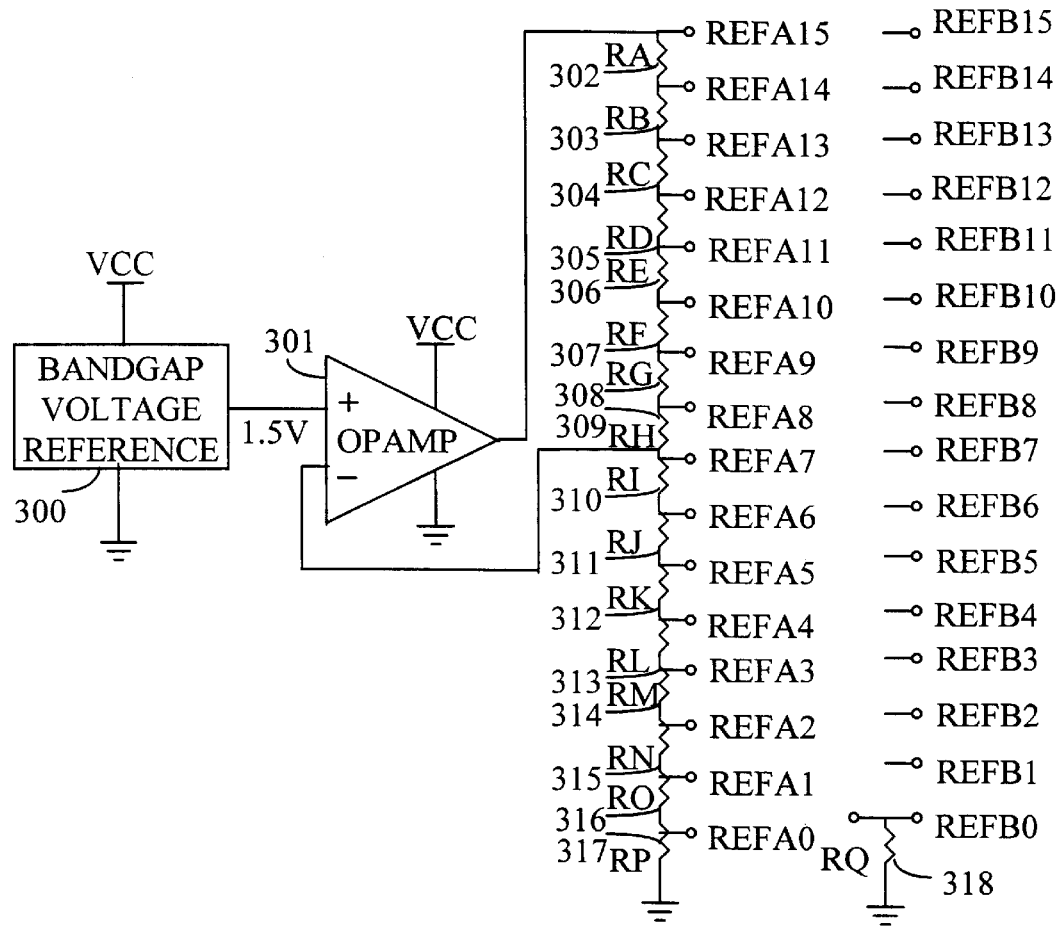
FIG._11
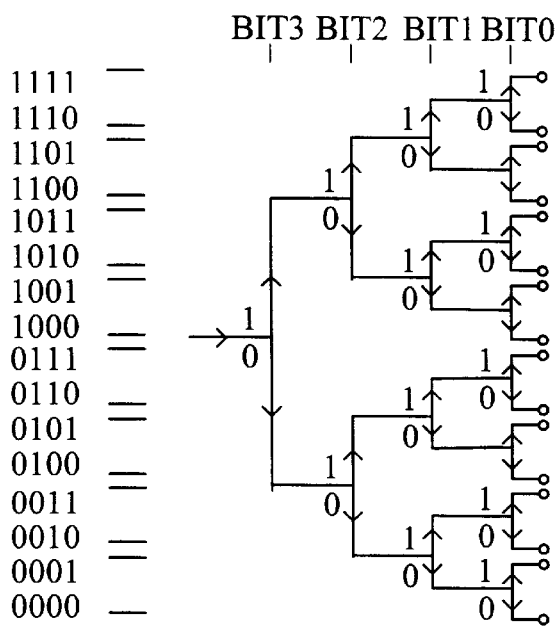
FIG._12A

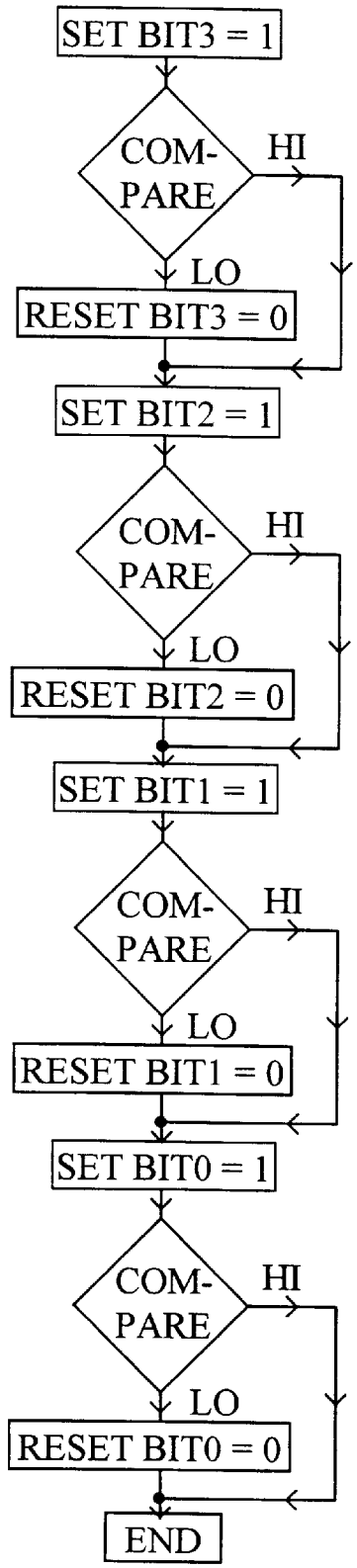
Fig._12B

INTEGRATED CIRCUIT FOR STORAGE AND RETRIEVAL OF MULTIPLE DIGITAL BITS PER NONVOLATILE MEMORY CELL

This is a Continuation of application Ser. No. 08/540,117 filed Oct. 6, 1995, now U.S. Pat. No. 5,687,114, the disclosure of which is incorporated by reference.

FIELD OF THE INVENTION

This invention relates in general to semiconductor memories and, in particular, to nonvolatile semiconductor memories with the ability to store multiple digital bits per memory cell.

BACKGROUND OF THE INVENTION

Nonvolatile semiconductor memories, such as EEPROM, EPROM and FLASH integrated circuits, have traditionally been used to store a single digital bit per memory cell. This has been done by changing the threshold voltage (conduction) characteristics of the cell by retaining a certain amount of charge on the floating gate of the memory cell. The threshold voltage range is normally partitioned into two levels (conducting versus nonconducting) to represent the storage of one digital bit per memory cell.

A wide range of charge can be reliably stored on the floating gate to represent a range of threshold voltages. Charge retention on the floating gate can be partitioned to represent multiple number of threshold voltage ranges and the threshold range can be partitioned into multiple ranges to represent storage of more than one bit of digital data per memory cell. For example, four threshold partitions can be used to represent storage of two digital bits per memory location and sixteen partitions to represent storage of four digital bits per memory location. Furthermore, the threshold voltage range can be partitioned to appropriately finer resolution to represent the direct storage of analog information per memory cell.

The ability to store multiple digital bits per memory cell increases the effective storage density per unit area and reduces the cost of storage per digital bit. In addition to this, in the field of semiconductor memories, the costs of a modern fabrication facility often exceeds a billion dollars. Application of multibit storage per cell techniques to existing memory fabrication processes and facilities allows the production of the next generation of higher density storage devices in the same manufacturing facilities, thereby increasing profitability and the return on investment.

Nonetheless, the problem of operational speed, i.e., the reading and writing operations, have yet to be satisfactorily addressed for devices having multiple bits per memory cell. A related problem is power dissipation. As more power is used to increase operational speeds, power consumption is also undesirably increased. Still another problem is reliability. While charges can be stored in the floating gates of memory cells for very long periods, erasing and rewriting charges causes long term problems as to the certainty of the bits stored in a memory cell. And, of course, any integrated circuit has problems of space. In an integrated circuit having multiple bits per cell, additional circuits must be added to handle the new requirements. This partially negates the advantages of the increased bits per memory cell.

The present invention solves or substantially mitigates these problems. The present invention speeds up the reading and writing operations of multibit memory cells. Power dissipation is lowered for reading operations. The present invention also permits the reliable determination of the bits in the memory cells over the long term and also conserves space on the integrated circuit.

SUMMARY OF THE INVENTION

The present invention provides for an integrated circuit having an array of memory cells, each memory cell storing multiple bits of information, and at least one data terminal. The integrated circuit also has a plurality of latches connected to the array of memory cells with the latches organized into a first bank and a second bank. For reading and writing operations from and into the memory cell array, the latches and memory cell array are controlled so the first bank is coupled to the array of memory cells while the second bank is coupled to the data terminal. Alternately the second bank to the array of memory cells while first bank is coupled to said one data terminal. This alternate coupling permits data to be simultaneously transferred between one bank of latches and the array of memory cells and transferred between another bank of latches and the data terminal for faster read and write operations.

To lower power dissipation, the memory cells of the array are read by voltage-mode operation. Furthermore, during writing operations, a voltage corresponding to the amount of charge stored in the selected memory cell is compared to a reference voltage to determine whether high voltage programming of the memory cell should continue. Programming of the memory cells is terminated when the corresponding voltage matches the reference voltages.

For reading operations, the voltage corresponding to the amount of charge stored in a selected memory cell is compared to a sequence of reference voltages in a binary search pattern to determine the plurality of bits stored in the memory cell.

BRIEF DESCRIPTION OF THE DRAWINGS

FIG. 1 is a block diagram illustrating the major circuit blocks implemented on a single integrated circuit chip according to the present invention;

FIG. 3 shows the organization of the reference cells and array cells within a block and the connection of the threshold partition voltage reference generation blocks to their respective arrays;

FIG. 4 is a block diagram of the multilevel dual mode shift registers in FIG. 1;

FIG. 5 illustrates the general organization of two Y-drivers in FIG. 1;

FIG. 6 shows details of the multilevel dual shift registers in FIG. 4 and circuitry that allow the dual shift registers to be used both during writing and reading operations;

FIG. 7 illustrates the reference multiplexer circuit in FIG. 5 for each Y-driver;

FIG. 8A shows the circuit details of the voltage comparator, the latch, the program and read control block and the high voltage switch, which are common to each Y-driver;

FIG. 8B shows the circuit level detail of the voltage comparator, the latch, the program and read control block and the high voltage switch and the read mode path for the reference Y-drivers with additional circuitry which allow all reference cells in a block to be read in parallel; and FIG. 8C shows the details of the Y-multiplexer circuit of a reference Y-driver and Y-multiplexers;

FIG. 9A shows details of the Y-multiplexer common to all Y-drivers, the X-Decoder block, the X-multiplexer common to each X-decoder and memory cells common to one Y-driver and one X-decoder with connections to the reference Y-multiplexer and reference cell array; and FIG. 9B shows the circuit of a single transistor memory cell according to one embodiment of the present invention;

FIG. 10 is a scale from 0 Volts to Vmax Volts of the various program threshold partition voltages for the reference memory cells and the data storage memory cells;

FIG. 11 details the threshold partition voltage reference generation blocks; and FIG. 12A represents the tree decoding in the binary search algorithm in a read operation to determine the digital bits stored a selected memory cell; and FIG. 12B is a flow chart for the binary search algorithm for a read operation.

DESCRIPTION OF THE PREFERRED EMBODIMENTS

Figure 2A:
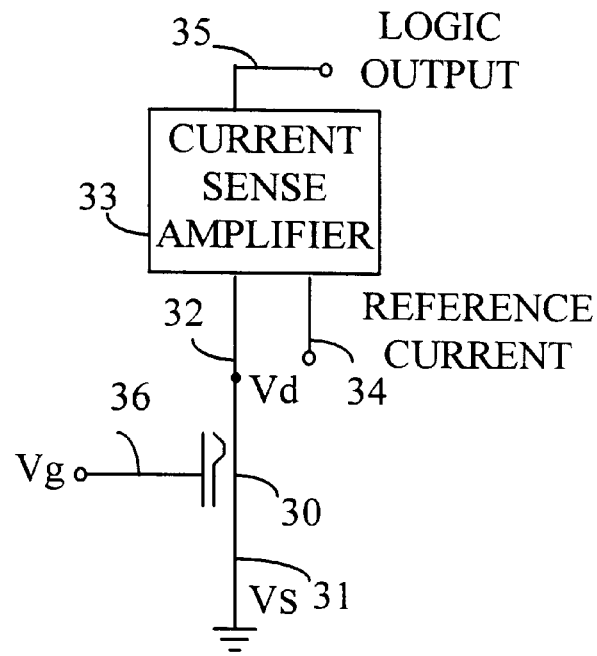
FIG. 2A shows a circuit generally illustrating current-mode reading of the memory cells in FIG. 1; likewise.

It should be noted that the drawings have the elements with same reference numeral. This emphasizes the similar structure or operation of the elements. Furthermore, the symbol for a MOS transistor has been somewhat modified to a straight line representing the source and drain of the transistor and a short line parallel to the source/drain line to represent the gate of the transistor.

General Description of the Integrated Circuit

The major blocks of a preferred embodiment of the present invention are shown in FIG. 1. A nonvolatile memory array 1 and a reference memory array 2 has memory cells connected in a two dimensional array of rows and columns. The memory cells can be any of the existing device architectures, such as, for example, EPROM, EEPROM, FLASH, or existing cell structures, such as single transistor, two transistor, split-gate, NAND, AND, and DINOR cell structures, or ground array architecture, including standard and virtual ground, known in prior art. Depending on which device architecture, cell structure or ground array architecture, is chosen, specific programming, erase and read algorithms can be easily developed, including the specific voltages required at each of the electrical terminals of the cell to facilitate the storage of more than one digital bit per nonvolatile memory cell. A cell can hold more than one nonvolatile device, for example, a NAND, DINOR or AND cell structure, already known in prior art. The specifics of the device, array architecture or cell structure and algorithms are not part of the present invention.

Each of the memory arrays 1 and 2 are further organized into blocks, having single or multiple rows. Each block consists of all of the columns or part of the columns of the arrays 1 and 2. In FIG. 1 a memory block is shown with all the columns in a single row. Each memory block consists of the cells from the reference array 2 and the cells from the memory array 1.

An error correction array 3 has nonvolatile memory cells similar to those used in the memory 1 and the reference array 2. In one embodiment, the error correction array 3 contains additional coding information required for an on-chip Error Correcting Code (ECC) mechanism, as is known in prior art for ECC implementation. In another embodiment, the error correction array 3 contains the full address of defective cells which should be avoided during a write or a read operation.

The size of the error correction array 3 depends on the maximum number of defective cells which may be corrected. During a production verification phase, the memory array 1 is tested to identify any defective cells. The address of these defective cells are programmed into the error correction array 3 before the chip is shipped from the factory. The error correction array 3 may be programmed using more than one bit per memory cell or may be programmed using a single bit per cell. If ECC correction is implemented, the error correction array 3 is automatically loaded with coding bits with on-chip ECC circuitry. An error correction control and logic block 16 contains all the necessary addressing, decoding and sequencing circuitry necessary to implement either one of the error corrections embodiments mentioned above.

A memory management array 4 contains address information for the blocks that are available for further writing at a certain time and also physical address information for blocks during sequential writing or reading of multiple blocks which are not necessarily physically contiguous in the memory array but are logically contiguous. Memory management of the array improves the long term reliability of the product and also allows for more efficient use of the memory in environments where serial data of variable length are frequently erased and rewritten. In such operations, only the beginning and ending block addresses are provided and the data is accessed through clocking. Instead of providing the ending block address, a stop signal can also be used to signify the end of the variable block serial data. The mode is called the "serial write and read access" mode and is generally used for digital audio record and playback systems, and also for semiconductor memory systems which replace mechanical disks. The serial write and read access mode with error correction and memory management allows the present invention to substitute integrated circuit memory for digital audio record and playback systems and also for general digital data storage systems. A memory management logic block 24 contains the necessary sequencing circuitry to perform the memory management function in conjunction with the memory management array 4. The data in the memory management array 4 may be simply a single bit per memory cell or more than one digital bit per cell as in the arrays 1 and 2.

A redundancy block 5 has additional blocks of memory cells that can be used to repair whole blocks of cells which cannot be used. This sort of block redundancy is known to designers of memory integrated circuits. The number of blocks in the redundancy block 5 defines the maximum number of blocks that can be repaired either during the production verification phase or in the field during an embedded repair phase.

Addressing of the memory cells of the array 1 is provided by an address decoder 13 which is coupled to a serial interface block 14 which is connected to the external world. The decoded addresses are passed to a Y-counter block 12 and an X-counter block 11 from the decoder 13. The output from the Y-counter block 12 is passed to a Y-multiplexer block 8 which selects the desired block of memory cells in the array 1. The output of the X-counter block 11 is decoded in the X-decoder block 7 and the X-multiplexer block 6, to select the desired row in the selected block in the memory array 1.

The address decode block 13 generates the starting address of a selected row. The decoded address is set into the X-counter 11 and Y-counter 12 at the beginning of each new access operation of a certain length of data stream. After the starting address is provided, data is serially accessed by a clock input to the chip. The serial interface block 14 contains the circuitry required to perform the appropriate serial protocol with other external chips. The serial protocol can be any of the industry standard serial protocols or a proprietary protocol. Generic serial interface signals are shown in FIG. 1 going in and out of the serial interface block 14.

The X-counter block 11 contains digital counters which increment their count by a clock signal YOUT, the output of the Y-counter block 12, on a line 27. The Y-counter block 12 is clocked by a signal CLCK on an input line 28 and generates a clock signal SHFT CLK on a line 29 to the various sections of the Y-drivers. The Y-counter block 12, in turn, provides the clock signal YOUT on the line 27 to the X-counter block 11.

The X-multiplexer block 6 provides the output of one X-decoder stage in an X-decoder block 7 on a selective basis to multiple rows of the array. This accommodates the circuitry of an X-decoder without letting the aspect ratio of the integrated circuit layout of the X-decoder from becoming inordinately large. X-multiplexers and their use are known in the prior art. The X-decoder block 7 contains the X-decoders which are used to select the rows of the memory array 1 and 2. Details about the X-decoder block 7 and the X-multiplexer block 6 are provided below and are also shown in FIG. 9A. The Y-multiplexer block 8, similar to the X-multiplexer block 6, selects the output of one of the Y-drivers, described in more detail below, and provides it on a selective basis to any one of a number of columns of the memory array. This is again done to fit the pitch of the Y-drivers and the memory array in the column direction.

A read-write circuit block 9 contains the necessary circuitry to perform high-voltage write and low-voltage read operations of data to and from the array 1. Details about the read-write block 9 are provided below.

A multilevel dual-shift register block 10 which has serially connected latches lies between the data input and output terminals and the memory array 1 and 2. Data to be written into the memory array 1 is moved serially through a DATA IN 25 line to the block 10 to the memory array 1. Data to be read from the memory array 1 is moved from the memory array 1 to the block 10 and then transferred serially from the block 10 through a DATA OUT 26 line. A detailed description is provided below. A system control logic block 15 contains the necessary control and sequencing circuitry to allow proper system operation. A test mode control and logic 17 block contains circuitry that allow full functional testing of the chip. Through the use of test modes, the chip is reconfigured into various alternative test configurations that allow faster and more efficient verification of the chip. These test modes are normally accessed in the verification phase at the factory but certain test modes may also be accessed in the field, such as for array repair test modes using the redundancy block 5.

A program/erase/read algorithm block 18 provides all the control and sequencing signals to perform the intelligent programming, erasing and reading of digital data from the memory array 1.

An oscillator block 19 generates clock signals for the high voltage generation and also provides clock signals for the program/erase/read algorithm block 18 and also for other system clocking and synchronization purposes. Alternatively, if the oscillator block 19 is not placed on-chip, then its output signals must be supplied externally to the integrated circuit.

A charge pump 20 block generates high voltages on-chip. A high voltage shaping and control block 21 receives the output signal of the charge pump block 20 and properly shapes the high voltage pulses with predetermined rise and fall times. High voltage pulse shaping is critical for long term reliability of the operation of the integrated circuit. High voltages shaped pulses can also be provided externally. Or unshaped high voltage can be provided from an external source, which can be then be pulse shaped with the proper rise and fall times with on-chip circuitry.

A nonvolatile scratch pad memory and registers block 22 has memory cells similar to those in the nonvolatile memory array 1. These memory cells are suitably organized and are normally used for external system house keeping and feature requirements. In an audio record and playback system, for example, the nonvolatile scratch pad memory and registers block 22 contains the information for the number of messages and the time at which these messages were recorded. Data in the scratch pad memory and registers can be stored as single or multibit per memory cell.

An on-chip bandgap reference block 23 generates the necessary analog voltage and current references required for operation of the integrated circuit. These voltage and current references are used to provide reference voltages and currents which are compensated for temperature and power supply variations. System performance is stabilized over wide temperature and power supply ranges.

General Reading Operation of a Memory Cell

Heretofore, current-mode operation is typically discussed for the reading of multiple bits per memory cell. Current-mode reading has an advantage of fast access times. FIG. 2A illustrates the general circuit arrangements for reading in the current-mode, using a single transistor memory cell. This general topology is applicable to other cell structures too.

A nonvolatile memory cell 30 is typically connected in an inverter mode. The voltage Vs at the source 31 of the transistor, which forms the cell 30, is connected to ground. The control gate 36 of the memory cell 30 is connected to a suitable voltage, Vg, or switched to the power source voltage. The drain of the memory cell 30, which also forms part of a column line 32 of the memory array of which the memory cell 30 is a part, normally is connected to a current sense amplifier 33. The nonvolatile memory cell 30 is connected to the column line 32 through some selection circuitry (not shown here for simplicity's sake). The current sense amplifier 33 typically is also connected to a reference current input line 34 for comparison purposes. The result of the comparison between the column line 32 current through the nonvolatile memory cell 30 and the reference current line 34 is generated as a logic level at the logic output line 35.

For a single bit per cell, the simple absence or presence of current through the memory cell 30 is determined. For multibits per memory cell, the amount of current passing through the cell 35 is compared against a set number of currents by changing the reference current at the input line 34. The signal at the logic output 35 is then decoded to determine the stored bits. For example, U.S. Pat. No. 5,172, 338 by Mehrotra et al. teaches multibit reading schemes using current-mode reading and also shows various alternative embodiments. However, while current-mode reading could be used in the present invention, reading of memory cells in the voltage-mode is preferred. This lowers power consumption compared to the current-mode technique and renders the multibit per cell memory integrated circuit more appropriate for low power, relatively slower access applications, such as audio record and playback systems, and mechanical magnetic disk replacement systems.

Figure 2B:
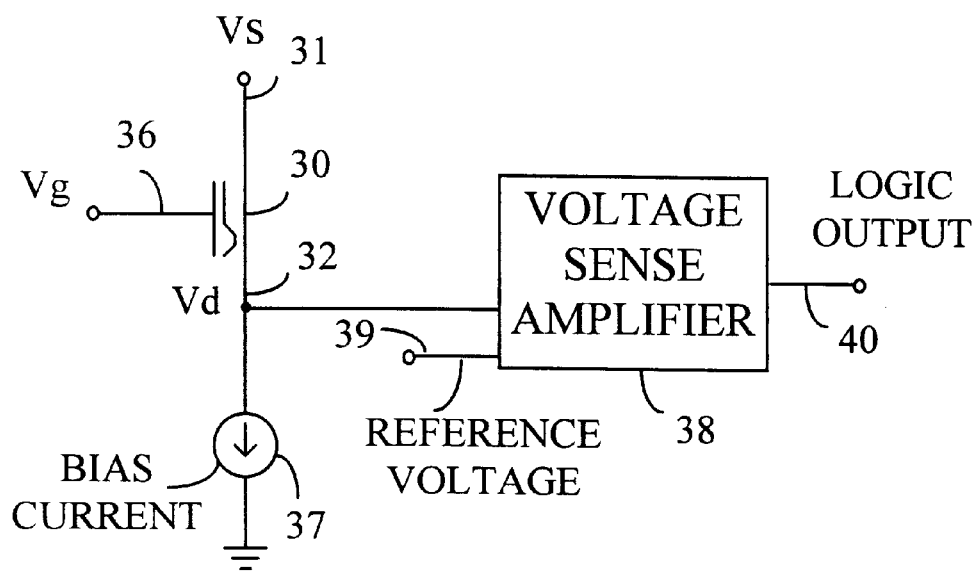
FIG. 2B shows a circuit generally illustrating voltage-mode reading of the memory cells in FIG. 1.

In voltage-mode reading, the nonvolatile memory cell 30 is connected in the source follower mode, as illustrated in FIG. 2B, using a single transistor memory cell. The general voltage-mode topology is also applicable to other cell structures. The source 31 of the transistor forming the cell 30 is connected to a regulated supply at voltage Vs from a stable voltage reference, such as a bandgap reference. The control gate 36 is also connected to the same supply voltage as the source 31 or a voltage that is high enough to allow the accurate reading of the highest expected voltage Vd at the drain of the cell 30. A stable fixed bias current circuit 37 is connected between ground and the transistor's drain, which also forms part of the column line 32 of the memory array, as in FIG. 2A. The amount of fixed bias current is small, in the range of 0.5 microampere to 5.0 microampre. This small current prevents undue cumulative trapping of electrons during multiple read cycles, thereby preventing false readings of the memory cell 30. The voltage at the drain, which is also connected to the column line 32 through selection circuitry (not shown here), is equal to Vg–Vgd, where Vgd is the gate-to-drain voltage of the memory cell 30 required to source the current drawn by the bias current circuit 37. The drain of the transistor, part of the column line 32, is connected to an input terminal of a voltage sense amplifier 38. The voltage sense amplifier 38 also has a reference voltage input line 39 and a logic out put line 40. Voltages at the transistor drain, the column line 32, and the reference voltage line 39 are compared and the resulting logic output signals are provided at the logic output line 40. The current required for reading in the voltage-mode is much less than for the current-mode. Thus reading in the voltage-mode has lower power dissipation.

The voltage read out at the line 32 depends on the amount of negative charge (electrons) on the floating gate 36 of the non-volatile memory cell 30. A large amount of charge on the floating gate increases the threshold voltage of the cell 30. The higher threshold voltage increases the gate-to-drain voltage Vgd of the cell 30. The voltage at the line 32 is then lower with respect to ground. Conversely, when the amount of charge in the floating gate is low; the threshold voltage of the cell 30 is lowered and the Vgd is decreased. The voltage at the line 32 is then higher with respect to ground. By controlling the amount of charge on the floating gate, suitable read back voltages are generated at the line 32. The process of injecting negative charge (electrons) into the floating gate is referred to as "erasing" and the process of removing charge from floating gate is referred to as "programming" the floating gate or memory cell.

During a multibit reading from a single memory cell, the voltage at the transistor's drain is compared to various voltages at the reference voltage line 39. The logic output at the line 40 is then decoded to provide the appropriate bits. With the source follower connection of the memory cell 30, data access is slowed because the whole column line 32 must be pulled up through the small memory cell. For certain applications, this slower access rate is acceptable. As described below, the multilevel dual shift registers effectively improve the read access times.

Organization of the Memory Arrays

FIG. 3 illustrates the organization of the nonvolatile memory array 1 and the nonvolatile reference array 2. The memory cells in the reference memory array 2 are used to generate the comparison reference voltages for a voltage sense amplifier to determine the bits stored in the memory cells selected in the array 1. In the preferred embodiment described here, four bits are stored per memory cell of each array 1 and 2. As mentioned previously, each block in the preferred embodiment consists of a row. Each row consists of reference memory cells and array memory cells. All the cells in a row are erased simultaneously, and depending on the Y-multiplexer multiplexing scheme only part of the row is programmed and read from simultaneously. Since four bits are stored per memory cell, there are sixteen reference memory cells per row. In this embodiment, each Y-driver drives eight memory cells so there are two Y-drivers 42 for a row of sixteen cells in the reference array 2. These Y-drivers 42 are labeled REFY-DRIVERs. In FIG. 3 only three Y-drivers 41 for the memory array 1 are illustrated. There are M Y-drivers 41. The three memory array Y-drivers shown are labeled Y-DRIVER0 to Y-DRIVER2. A reference threshold partition voltage generation block 44, part of the bandgap reference block 23 of FIG. 1, drives sixteen reference lines, each with one of the reference voltages REFB0–REFB15, into the REFY-DRIVERS 42 and an array threshold partition voltage generation block 43, also part of the block 23 of FIG. 1, drives the sixteen reference lines, each with one of the reference voltages REFA0–REFA15, into the array Y-drivers 41. The voltage relationships between the REFA0–15 and REFB0–15 signals is shown in FIG. 10.

During a writing operation, a WRITE signal on WR line 46 is high, which turns on a set of N-channel transistors 45 (outlined by a dashed rectangle). The sixteen REFA0–15 reference voltages of the block 43 are passed to the Y-driver reference voltage lines, RFL-015. These reference level voltages, REFA0–REFA15, from the block 43 are selectively programmed into the memory array 1 cells. Likewise, the reference voltages, REFB0–REFB15, from the block 44 are selectively programmed into the reference cells of the array 2.

During a reading operation, the WRITE signal on the WR line 46 is driven low to turn off the transistors 45. Instead, a set of transistors 47 (also outlined by a dashed rectangle) are turned on to pass the reference REFB0–15 output voltages stored in the reference cells of the array 2 to the Y-driver 41 reference voltage lines, RFL0–15. The REFB0–REFB15 voltages stored and read back from the cells of the reference array 2 are used as reference voltages to ascertain the digital bits stored in the cells of the memory array 1 through a binary search technique described below. The use of reference cells per block, or row as in the preferred embodiment, cancels power supply and temperature variations by placing such variations in the common mode. The memory cells in both array 1 and 2 are subject to the same variations. The reference cells in array 2 are also subject to the same number of program and erase cycles as that of the memory cells in the array 1, thereby placing the long term aging effects of the cells in a block or row in the common mode. This reference mechanism has the advantage of lower current read back mode and allows for longer and better long term reliability and accurate read back of digital bits, compared to previously described techniques. The on-chip threshold voltage generation (temperature and power supply compensated) blocks 44 and 43 also create higher reliability compared to prior efforts in this field. The blocks 44 and 43 do not use nonvolatile memory cells to generate threshold partition voltages, but rather depend on much more reliable and stable components, such as resistors, operational amplifiers and bandgap voltage sources. Thus the present invention has improved long term reliability and accuracy, and stability over temperature and power supply variations.

In another embodiment of the present invention, the cells of the reference array 2 are first programmed. Then the output of the programmed reference cells from the array 2 are used to selectively program the cells of the memory array 1, with an offset to place the programmed levels midway between the programmed reference levels, as indicated in FIG. 10. This method does not require the block 43 but requires additional time to program the reference cells first.

Dual Shift Registers for Data

FIG. 4 is a block level representation of the multilevel dual shift registers block 10, shown in FIG. 1 and part of each of the Y-drivers 41 of FIG. 3. The multilevel dual shift register block 10 has latches which are organized into two banks, A and B. Each bank of latches is connected serially to form a large shift register. Each bank has four latches for each Y-driver 41. In FIG. 5, for each Y-driver 41, during a writing operation the data enters serially through the dual shift registers of block 10 and during reading operations the data exits serially through the dual shift registers of block 10. The data information travels from top to bottom within each Y-driver 41 during writing operations and from bottom to top during reading operations. In general, signals common to all Y-drivers 41 travel horizontally.

Of course, the depth of the Y-driver latches depends on the number of bits stored in one memory cell. In the preferred embodiment four bits are stored in each cell. Therefore, four latches exist per each Y-driver 41. For example, in FIG. 4, the Y-driver 0 has four serially connected latches 60–63 and the Y-driver 1 has four latches 65–67. Continuing further, Y-driver M–1 has the last four latches connected serially. M is the number of Y-drivers and therefore, the total number of latches is 4×M. It is important to note that all the latches are connected across all of the Y-drivers 41 of a bank in a long serial link to form a shift register. True and complementary outputs of every latch are parallel, as described below with respect to FIG. 6.

The two shift registers, bank A and bank B, are connected through transmission switches 145 and 146 to the DATA IN line 25 and DATA OUT line 26, respectively. When a REGSEL control line 147 is high, the DATA IN line 25 and the DATA OUT line 26 are connected to the bank A shift register through the switches 145. When the REGSEL line 147 is low, the DATA IN line 25 and the DATA OUT line 26 are connected to the bank B shift register through the switches 146. The SHFT CLK signal on the line 29 clocks the shift registers. With every cycle of the SHFT CLK signal, the data bits move to the next latch. For example, the bit in latch 60 moves to latch 61 and the bit previously in latch 61 moves on to latch 62 and so on. In the normal operation of the dual shift registers, one bank always operates in the serial mode and the other bank in the parallel mode. The bank which is in the serial mode, receives data from, or reads data out of, the data terminals connected to the DATA IN and DATA OUT lines 25 and 26 serially. At the same time, the other bank in the parallel mode receives data from, or loads data into, the memory cells of the array 1 in parallel. As the bank in the serial mode completes its serial operations on the data, the other bank simultaneously completes its parallel operations with the data to and from the array 1. Thereafter, the serial bank is switched to the parallel mode and the parallel bank is switched to the serial mode by changing the state of the REGSEL line 147. This synchronous switching from serial to parallel and vice versa occurs continuously during writing into and reading from the memory array 1. Since there are M Y-drivers, M memory cells are written in parallel. Since four bits are written per cell, a total of 4×M bits are written in parallel. This essentially provides a 4×M faster write rate compared to a single bit operation. Similarly, 4×M bits are read in parallel and then shifted out providing 4×M faster read rates. In fact, the read rate can be performed even faster by clocking the shift registers at a higher clock rate. The maximum clock rate is limited by the time required for the parallel data to be loaded into the latches for a serial shifting operations. Hence, as described above, the multilevel dual shift registers block 10 allows for faster read and write access times of the memory cell array 1.

The switching between bank A and bank B during both reading and writing operations can also be non-synchronous. For example, during writing operations, if the latches of the bank in the serial mode are loaded before the latches of the other bank in the parallel mode can program the memory cells with multiple bits, then the switch of serial and parallel modes between the two shift registers must wait until for the bank in the parallel mode part completes its programming operation. Conversely, if the parallel mode programming operation is completed before the serial operations of the first bank are completed, then the parallel mode bank must wait until the serial mode bank is loaded with data. The same is true for read operations. Thus both synchronous and non synchronous operations of the dual shift register operation are possible through the implementation of the appropriate circuitry in the system control logic block 15 (shown in FIG. 1). Details of the latches 60–63 of the Y-driver0 and latches 64–67 of the Y-driver1 are shown in FIG. 6.

Data Between Dual Shift Registers and Memory Array

FIG. 5 illustrates the organization of the Y-drivers 41 with the multilevel dual shift registers block 10, the read-write block 9 and the Y-multiplexer block 8. The individual Y-drivers 41 are each the same in terms of operations and circuit detail. Only Y-driver 0 and Y-driver 1 are shown. The other Y-drivers up to Y-driver M–1 are represented by dashed lines.

FIG. 7 illustrates the circuit details of a reference multiplexer 50 of each read-write block 9 in a Y-driver 41. The true and complementary output signals of each of the latches within a Y-driver 41 are passed to a reference multiplexer 50. Depending on the particular bits in the four latches within a Y-driver 41 (in this case, Y-driver 0), the reference multiplexer 50 connects one of the reference voltage lines, RFL0–RFL15, to the RFLOUT output terminal of the multiplexer 50. Signals on the lines 60A, 61A, 62A, 63A and 60B, 61B, 62B, 63B carry the true and complementary output signals, AA, AB, BA, BB, CA, CB, DA and DB, respectively from the four latches of each Y-driver 41, as shown in FIG. 6.

The reference multiplexer 50 is essentially a 16-to-1 multiplexer, commonly known in prior art. As apparent in FIG. 7, only one of the RFL0–15 signals appears as the output signal RFLOUT, depending on the signals, 60A through 63B, from the output terminals 60A–63B of the latches. Transistors T11 through T164 are N type transistors and the operation of the multiplexer 50 should be understood. The size of the multiplexer depends on the number of bits that are being stored in one memory cell. For example, a 6 bit per memory cell storage system requires a 64-to-1 multiplexer.

FIG. 8A shows the details of the Voltage Comparator 51, the Latch 52, the Program/Read control circuit 53 and the High Voltage Switch 54 of the read-write block 9. The circuitry in FIG. 8A is common to each of the Y-drivers 41. The Voltage Comparator 51 has transistors 70–76. Transistors 70 and 71 are P-channel transistors and the rest are N-channel transistors. A VBIAS voltage on a line 198 from the block 23 in FIG. 1 provides proper current biasing for the Voltage Comparator 51. The circuit of the Voltage Comparator 51 is known in prior art. Whenever the voltage on a signal line 200 to the gate of the transistor 73 is higher than RFLOUT voltage on the signal line to the gate of the transistor 72 by even a very small amount, then the SET output on the Voltage Comparator output line 199 is also high, and vice versa. The gate of the transistor 73 is normally called the non-inverting input and the gate of the transistor 72 is called the inverting input. The signal line 200 and the signal line 206 described below connect the non-inverting input to the Y-multiplexer 55. The two lines 200 and 206 form a path to read the multiple bits stored in the cells of the array 1. The inverting input receives the RFLOUT signal, the output of the reference multiplexer 50, as previously described. The SET output line 199 of the Voltage Comparator 51 is connected to an input terminal, the gate of the transistor 80, of the Latch 52.

The Latch 52 has transistors 80 through 85. Transistors 82 and 83 are P- channel transistors and the rest are N-channel transistors. The Latch 52 is a classic cross coupled inverter type with an input node, the gate of the transistor 80, connected to the SET output line 199 and another input node, the gate of the transistor 85, connected to the RESET input line 202. This latch circuit and its operations is well known to integrated circuit designers. The transistors 81 and 82 form one inverter and the transistors 83 and 84 form the other inverter. The output node of the Latch 52 is connected by a signal line 201 to the Program Read Control circuit 53. When the signal on the SET line 199 is high or pulsed high, the Latch output on the output line 201 is high. When the RESET line 202 is high or pulsed high, the signal on the Latch output line 201 is low. The signals on the SET line 199 and the RESET line 202 are never high at the same time.

The Program/Read Control circuit 53 has two AND gates 88 and 89 and two inverters 86 and 87. A PROG (program) line 204 is an input to this circuit. The signal on the PROG line 204 is high when the write mode is active, i.e., a writing operation, and is low when the read mode is active, i.e., a reading operation. When PROG is high (write mode active), the output of the AND gate 88 depends on the state of the output line 201 from the latch 52. If Latch output line 201 is low, then the output of the AND gate 88 on the line 205 is high if the PROG signal on the line 204 is high, and vice versa. When the signal on the PROG line 204 is high (write mode active), then the output of the AND gate 89 is low. The output line 203 of the AND gate 89 is connected to the gate of a transistor 100. During writing operations, the transistor 100 is turned off and does not allow signals to pass from the line 206, which is connected to the Y-multiplexer 55, to the line 200. Lines 200 and 206 form part of the read path.

The High Voltage Switch 54 has an inverter 90, two N-channel transistors 91 and 94, a capacitor 92 and a high voltage transistor 93. The High Voltage Switch 54 operates as a transmission gate which allows high voltages on an HV line 209 from the high voltage shaping and control block 21 (FIG. 1) to pass to the line 206 when the line 205 is high, or blocks high voltages from the HV line 209 from passing to the line 206 when the line 205 is low.

Connected to the read path formed by the signal lines 200 and 206 are the transistors 101 and 102 which provide the current load to a selected nonvolatile memory cell during reading operations. A VB line 208 is a current bias line generated from the Bandgap Reference block 23 (FIG. 1) to the gate of the transistor 102. The transistor 102 operates as a source of the load current during the read mode. The transistor 101 with its control gate connected to a VCTL line 207 acts as a switch to turn the load current on or off.

Inverters 103 and 104 buffer the SET output on the line 199 from the Voltage Comparator 51 and provides an output signal on a READ DATA line 210 during reading operations only. The line 210 is connected to its corresponding latches (see FIG. 6) and the line 206 to its corresponding Y-multiplexer 55. Thus the transistors 101 and 102 act as the bias current circuit 44 and the Voltage Comparator 41 acts as the voltage sense amplifier 41 of FIG. 2B for reading operations in the voltage-mode.

FIG. 8B shows the read-write block 9 of the reference Y-drivers 42. The Voltage Comparator 51, Latch 52, Program Read Control 53 and High Voltage Switch 54 are same as that of the Y-drivers 41 for the memory array 1, but there are modifications to read eight reference memory cells at a time. During a reading operation, a reference Y-driver 42 reads all the reference cells connected to it. Since there are eight reference cells for each reference Y-driver 42 in the present embodiment, there are eight current loads formed by the transistors 111 and 112, each set of transistor output by dashed boxes. The eight VCTL0–VCTL07 lines are forced high to connect the current loads to their respective read lines 220–227.

During writing operations, only one of the reference cells is written to, as selected by the REF Y-multiplexer 56, shown in FIG. 8C, in reference Y-driver 42. Whenever any one of the control lines MCTL0–MCTL7 is high, the bit line side RVD (FIG. 9A) is connected to the read path lines 260–267 in FIG. 8B.

During a reading operation, all the VCTL0–VCTL07 and MCTL0–MCTL7 control lines are high; this allows all the reference cells to be read in parallel. All VCTL0– VCTL07 control lines high also places the current loads on the respective read paths of the reference cells. In a reading operation the READ signal 219 is also high to allow the read voltage from the reference cells to be passed to the RFL lines. Eight reference voltages read back from the reference cells 0–7 are passed to the RFL0–7 signal lines respectively through reference Y-driver0 and eight reference voltages read back in parallel from the reference cells 8–15 are passed to the RFL8–15 signal lines through reference Y-driver1. In the present embodiment it is assumed that the voltages REFB0–15 (FIG. 10) are programmed into the reference cells 0–15 respectively. With the READ signal on the line 219 high, the transistors 211 are OFF and thus the read back voltage signals do not pass to the Comparator input line 200. Notice that transistors 110 and 93 have been placed similarly on all the lines to allow same functionality during a writing operation mode for all the reference cells as occurs to the memory cells in array 1 through the Y-drivers 41.

In the reference Y-multiplexer 56 shown in FIG. 8C, each MCTL signal drives three series transistors M1, M2, M3. This arrangement provides same impedance on the line as provided by the Y-multiplexer 55 for the array 1, since there are three transistors in series whenever a memory array 1 cell is selected by the Y-multiplexer 55. This achieves better write and, more importantly, read mode matching characteristics between the cells of the reference array 2 and the memory array 1. The inverters 103 and 104 in FIG. 8A have been removed in the FIG. 8B. This is because in read operations digital bits are read out from the cells of the memory array 1, whereas reference voltage levels are read out from the cells in the reference array 2.

FIG. 9A shows a Y-multiplexer 55 for the Y-driver 41 for the memory array 1. The Y-multiplexer 55 is similar to the reference multiplexer 50. In the present embodiment the Y-multiplexer 55 is 8-to-1. The type of the multiplexer varies (N to 1) depending on the cell size and also on the amount of circuitry in the Y-drivers. For the described Y-multiplexer, a single transmission path is connected between the line 206 and one of the lines, VD0 through VD7, depending on the Y-address signals M0A–M2A and M0B–M2B from the Y-counters. VD0 through VD7 are the column lines in the memory array 1. During program and erase operations, the signals pass from the line 206 to the VD0–7 lines. During a read operation, signals pass from the VD0–7 lines to the line 206.

FIG. 9A also shows connections to a certain number of the nonvolatile memory cells of the array 1. In this embodiment, one Y-driver drives eight columns and one X-decoder drives four rows of the array 1. Each row is considered to be a block in the present embodiment. In other embodiments, multiple rows may form one single block. The selection of the rows by a single X-decoder is performed by the X-multiplexer 58 receiving four X-address signals, PA through PD, from the X-counters, as described previously. This basic topology can be extended in both the X-direction to increase the number of rows in the array and in the Y-direction to increase the number of columns, in order to increase the size of the array.

FIG. 9A also shows the reference array 2 and the reference multiplexers. There are sixteen reference cells from the reference array per block. Whenever a block is selected through the X-multiplexers 58, both reference and array cells are selected. The MCTL0–MCTL7 lines drive the reference Y-multiplexer 56.

For the embodiment described here, there are eight times more cells within one row than the number being programmed at one time. The Y-drivers 42 and 41 program every eighth cell in a row. A total of eight programming cycles are required to program all the cells in a row. Thus cells 0, 8, 16 . . . are programmed in the first programming cycle. Cells 1, 9, 17 . . . are programmed in the second programming cycle and so on. Eight programming cycles program one row. At the same time, the reference cells 0 and 8 are programmed in the first programming cycle. The reference cells 1 and 9 are programmed in the second programming cycle and so on until eight programming cycles complete the programming of all sixteen reference cells.

The latches of the REF Y-DRIVER0 and REF Y-DRIVER1 are set to output 0 and 8 respectively during the first programming cycle, to 1 and 9 respectively during the second programming cycle, and so to set the reference multiplexer of the reference Y-drivers 42 to select the proper RFLOUT voltage at the multiplexer's 50 output terminal from the REFB0–15 voltages provided by the reference generation block 44 shown in FIG. 3. During this writing operation, the latches of the reference Y-driver 42 are internally set to program the appropriate voltages into the reference cells at the selected locations in the array 2. At the same time, the latches of the Y-driver 41 are set externally by the data which is to be stored in the memory array 1. Of course, the number of programming cycles for a row is dependent upon the ratio of the Y-multiplexer. An 8:1 Y-multiplexer requires eight programming cycles, while a 16:1 multiplexer requires 16 programming cycles.

Reading Operations from the Memory Array

To further appreciate the voltage mode reading method in the details of the circuitry, reference should be made to FIG. 9A. The source line which is common for the both array 1 and 2 in the preferred embodiment is connected to a regulated supply voltage Vs. The connection to the transistor 35 of the cell of the arrays 1 and 2 are shown in FIG. 9B.

Assuming that the cell circled and marked XX in the array 1 is being read. The X-multiplexer 58 selects block 2 through line VG2, also called the word line. A word line is connected to the control gate of each of the memory cells in the block. The selected word line is connected to the same supply as is connected to the source, i.e., Vs, or to a voltage that is high enough to allow the accurate reading of the highest expected voltage at the column line VD4 with respect to ground. The Y-multiplexer 55 connects the column line VD4 to the line 206. Referring to FIG. 8A now, the line 206 is connected to the line 200 through the turned ON transistor 100. During a read operation, the PROG line 204 is low and RESET line 202 is high. This forces the gate 203 of the transistor 100 to be high to turn the transistor 100 on. The combination of transistors 101 and 102 form a current source (represented as the bias current circuit 37 in FIG. 2B) between the line 200 and ground. The line 200 also is connected to the non-inverting input of the Voltage Comparator 51 (represented as the voltage sense amplifier 38 in FIG. 2B). The transistor 101 acts as a switch for the current source. The transistor 101 is only turned on for a short period of time to accomplish proper voltage comparison by the Voltage Comparator 51. Power dissipation and also the potential for charges to be trapped in the oxide layer of memory cell transistor is minimized. The RFLOUT input (represented as the reference voltage 39 in FIG. 2B) connected to the inverting input terminal of the Voltage Comparator 51 is the voltage read back from the appropriate reference cell as selected through the reference multiplexer 50 from one of the lines RFL0–15 as shown in FIG. 5 and FIG. 7. The result of the comparison at the Voltage Comparator 51 is placed on the read data line 210 (represented as the logic output 40 in FIG. 2B). During read operations, the high voltage switch 54 is turned OFF and the high voltage line 209 is disconnected from line 206 by the high voltage transistor 93.

The dual shift registers, described previously, of the block 10 are used both in the write and the read operations in order to reduce the number of devices in the integrated circuit. The operation of the dual shift registers during a writing operation, has been described previously. In a read operation (refer to FIG. 6), the four latches in a Y-driver 41 are preset through the operation of the binary search algorithm. The signals BIT3, BIT2, BIT1, BIT0 are forced high sequentially according to the binary search algorithm shown in FIGS. 12A and 12B. The operation begins with a RESET pulse on the RESETB line of one bank of the multilevel dual shift registers. The RESET pulse resets all the latches on one bank of the dual shift registers. According to the binary search algorithm, the BIT3 signal is forced high. This sets the line 63A high and the line 63B low for all the latches connected to the BIT3 signal line, latches 0, 4, 8 and so forth), in all the Y-drivers 41. The voltage on the RFL8 line of the reference multiplexers 50 is thus selected for the RFLOUT terminal of each Y-driver 41.

At the same time during this read operation, the RFL0–15 lines are driven in parallel by the voltages read back from the cells of the reference array 2, as described previously. According to the binary search algorithm, if voltage read back from the memory cell is higher than the selected voltage on the RFLOUT within each driver, then the data output on the READ DATA line 210 in each Y-driver 41 is high. This forces the output terminal 601 of the NAND gate 600 low (see FIG. 6), which sets the latch connected to the BIT3 line. The signal at the output terminal 602 of the latch remains high even when the data on the line 210 is removed. Once the latch is set, the signals at the output terminals 63A and 63B remain high and low respectively, even when the line BIT3 is forced low. If the voltage read back from the memory cell is lower than the voltage at the RFLOUT terminal, then the signal on the READ DATA line 210 is low. This forces the signal at the output terminal 601 of NAND gate 600 to stay high and the latch to remain reset. Thus when the signal BIT3 is forced low, the signals at the latch output terminals 63A and 63B would be low and high respectively, the reset state of the latch. The binary search algorithm continues by forcing the BIT2, BIT1 and BIT0 lines high respectively. A compare operation of the voltages on the READ DATA line 210 and on the RFLOUT line within each Y-driver 41. The connected latches are set if READ DATA 210 is high or left reset if RESET DATA line 210 is low. Depending on the set or reset states of the latches within each Y-driver 41, a different voltage from the RFL0–15 lines is selected on the RFLOUT terminal through the reference multiplexer 50 inputs 63A,B to 60A,B (the output of the latches).

Sequentially four bits from a single memory cell are read into the four latches within each Y-driver 41. If N bits were stored per memory cell, then there would be N latches per Y-driver 41 and N bits per y-driver would be read in N cycles of the binary search algorithm. All the M Y-drivers 41 are simultaneously loading their respective latches. After the latches on one bank of the dual shift registers are loaded, the bank is placed in the shift mode and the latched data is then serially clocked out from this bank. While the data is being shifted out, the other bank of the dual shift registers is placed in the parallel read mode and the data of another M cells are read into the latches of this bank. As this bank completes loading its latches, the previous bank simultaneously completes its shifting operation. This alternating operation of parallel loading of data from the memory cells and serial shifting of data provides very fast read access times.

During a read operation, the state of the four latches within each reference Y-driver 42 is not used. The RFLOUT lines are not used within the reference Y-drivers 42. Instead, the voltages read from all the reference cells are placed on the RFL0–15 lines as shown in FIG. 8B and described previously.

Writing Operations into the Memory Array

For a write operation, the programming and erase algorithms, as is known in prior art, typically use a repetitive high voltage pulsed program cycle, followed by a normal read cycle, to set the threshold voltages of nonvolatile memory cells with a high degree of accuracy. Prior to initiation of the programming algorithm, an erase pulse of sufficient amplitude and duration is normally applied to completely erase the memory cells. Instead of one erase pulse, some algorithms also repeat the high voltage erase pulse followed by a read operation as necessary for the erase function. In the present invention a single erase pulse is used and then a repetitive high voltage pulse programming algorithm is applied to accurately set the threshold voltages. Also in the present embodiment the erase programming and reading occurs on a block basis for faster write and read access times. Thus M memory cells, representing 4 times M digital bits are simultaneously written to or read from.

After an erase cycle has erased all the memory cells in a block, the programming cycle is performed. Initially the Latch 52 (detailed in FIGS. 8A, 8B) in each Y-driver is reset by pulsing the RESET 202 line. Thereafter, on a repetitive basis after the application of each programming pulse a read cycle is performed. Within each Y-driver 41 and reference Y-driver 42, the read cycle is performed to determine whether the memory cell has reached the desired voltage level set at the RFLOUT output of the reference multiplexer 50. If the voltage level read back on the line 200 (FIGS. 8A, 8B) has not reached the RFLOUT level, then the Latch 52 remains reset and additional high voltage pulses are impressed upon the memory cell. The source of the high voltage pulses is the high voltage shaping and control block 21 described in FIG. 1.

During any of the repetitions, if the read back voltage on the line 200 is higher than the voltage on the RFLOUT line, the Latch 52 is set and the high voltage switch of the respective Y-driver 41 (and reference Y-driver 42) is turned off. This stops further transmission of high voltage pulses to the memory cell connected to that particular Y-driver. It should be understood that while certain Y-drivers may stop transmission of high voltage pulses to their respectively connected memory cells, other Y-drivers may still be passing high voltage pulses to their respective memory cells in order to program the appropriate read back voltage levels. The read back mode during programming is exactly the same as during the normal read mode, except that the output signals on the READ DATA line 210 (FIG. 6) is not stored by the latches of the block 10. The use of same reading circuitry during programming and reading modes provides more accurate and reliable data storage and retrieval.

FIG. 10 shows the relationship between the threshold partition reference levels for the nonvolatile reference array 2 memory cells and for the nonvolatile memory array 1 memory cells. The threshold voltage range to be partitioned is shown to be from 0V to Vmax. REFA0 to REFA15 are the threshold partition voltages for the nonvolatile memory array 1 cells and REFB0 to REFB15 are the threshold partition voltages for the nonvolatile reference array 2 cells. The REFA0–15 levels are midway between the REFB0–15 levels. This ensures accurate and reliable long-term read comparison of the threshold levels.

FIG. 11 shows the circuit details for threshold partition voltage generation blocks for both the nonvolatile memory array 1 and the nonvolatile reference array 2. A bandgap voltage reference unit 300 is an on-chip temperature and power supply voltage source. The operational amplifier OPAMP 301 is a high gain, unconditionally compensated amplifier. The circuitry for both the reference unit 300 and the operational amplifier 301 are known to integrated circuit designers. Resistors 302 through 318 are equal value resistors connected as shown.

The threshold partition generation block for the nonvolatile memory array 1 is formed when a resistor 318 is not connected in parallel to a resistor 317. The outputs are called REFA0 to REFA15. When the resistor 318 is connected in parallel with the resistor 317, then the nonvolatile reference array 2 threshold partition generation block is formed and the outputs are called REFB0 to REFB15. Through the programming algorithm, the sixteen reference cells per block in the preferred embodiment are programmed to each of the threshold partition voltages REFB0 through REFB15. The nonvolatile memory array 1 cells are programmed to any one of the REFA0 through REFA15 threshold partition voltage levels as defined by the bits in the latches within each Y-driver 41.

For the embodiment described here, there are eight times more cells within one row than the number of cells which are programmed at a time. The Y-multiplexers 55 program every eighth cell in a row. A total of eight program cycles are required to complete programming all the cells in a row. Thus, cells 0, 8, 16 and so forth are programmed during the first program cycle. Cells 1, 9, 17 and so forth are programmed during the second program cycle and so on for eight program cycles to complete the programming of one row.

At the same time, the reference cells 0 and 8 are programmed through the two reference drivers 42 during the first cycle; cells 1 and 9 during the second cycle, and so on, as selected through the reference Y-multiplexers 56. The latches of the REFY-driver0 and REFY-driver1 are set to binary values "0" and "8" respectively during first cycle, and binary values "1" and "9" respectively during second cycle, and so on to set the reference multiplexer 50 of the reference Y-drivers 42. The multiplexer 50 selects the proper voltage from the REFB0–15 voltages provided by the reference threshold partition voltage generation block 44 for the RFLOUT output voltage. In other words, during the writing operation, the latches of the block 10 of each reference Y-driver 42 are internally set to program the appropriate voltages into the reference cells at the selected cell locations, while the latches of the block 10 of the Y-drivers 41 for the memory array 1 are set externally from the data to be stored in the memory array 1. The number of program cycles per row depends on the depth of the Y- multiplexers 55 and 56. For example, as described, an 8:1 multiplexer for the Y-multiplexer 55 requires 8 program cycles, while a 16:1 multiplexer would require 16 program cycles to finish programming a full row.

While various preferred and alternate embodiments of the present invention have been disclosed and described in detail, it should be evident that the present invention is equally applicable by making appropriate modifications to the embodiment described above. Therefore, the above description should not be taken as limiting the scope of invention which is defined by the metes and bounds of the appended claims.

What is claimed is:

1. An integrated circuit comprising:

an array of memory cells, each memory cell capable of holding a voltage corresponding to a plurality of bits;

voltage generation circuits generating a set of reference voltage levels; and programming circuits connected to said memory cell array and said voltage generation circuits, said programming circuits simultaneously and independently programming voltages in a selected plurality of said memory cells with respect to said set of reference voltage levels, said programming circuits operative on each of said plurality of memory cells until a voltage programmed in said memory cell has a predetermined relationship with a selected one of said reference voltage levels and corresponds to a plurality of bits.

2. The integrated circuit of claim 1 wherein said programming circuits incrementally program voltage in each memory cell of said plurality of memory cells and compare a memory cell voltage of said each memory cell with said selected one reference voltage level for said memory cell after each programming increment to determine whether said memory cell voltage of said memory cell has reached said predetermined relationship with said selected reference voltage level.

3. The integrated circuit of claim 2 wherein programming circuits include a bias current reference generating a bias current through a terminal of each memory cell of said plurality of memory cells, said bias current independent of a voltage held in said each memory cell, and wherein voltage at said terminal, corresponding uniquely to a voltage held in said each memory cell for said bias current, is compared with said selected one reference voltage level.

4. The integrated circuit of claim 1 further comprising:

a plurality of latches holding said plurality of bits; and selection circuits connected to said plurality of latches, said voltage generation circuits and said memory cell array, said selection circuits selecting one of said reference voltage levels for each memory cell in said plurality of memory cells corresponding to said plurality of bits.

5. The integrated circuit of claim 4 wherein said memory cell array comprises data memory cells and reference memory cells, said selection circuits selecting one of said reference voltage levels for a data memory cell in said plurality of memory cells corresponding to said plurality of bits, and said selection circuits selecting another one of said reference voltage levels for a reference memory cell in said plurality of memory cells.

6. The integrated circuit of claim 5 wherein said reference memory cells provide reference voltages for reading said data memory cells.

7. The integrated circuit of claim 1 wherein said programming circuits are organized into M blocks and each memory cell of said memory cell array is capable of holding N bits, said programming circuits connected to simultaneously program a voltage in M memory cells corresponding to N bits in each of said M memory cells.

8. The integrated circuit of claim 1 wherein said memory cells comprise nonvolatile memory cells.

9. A method of programming a memory cell array in an integrated circuit, each memory cell in said array capable of holding a voltage corresponding to a plurality of bits, said method comprising:

generating a set of reference voltage levels; and programming voltages in a selected plurality of said memory cells simultaneously with respect to said set of reference voltage levels, said programming step independently operative on each of said plurality of memory cells until a voltage programmed in said memory cell has a predetermined relationship with a selected one of said reference voltage levels and corresponds to a plurality of bits.

10. The method of claim 9 wherein said programming step comprises:

incrementally programming voltage in each memory cell of said plurality of memory cells; and comparing a memory cell voltage of said each memory cell with said selected one reference voltage level for said memory cell after each programming increment to determine whether said memory cell voltage of said memory cell has reached said predetermined relationship with said selected reference voltage level.

11. The method of claim 10 wherein said programming step comprises:

generating a bias current through a terminal of each memory cell of said plurality of memory cells, said bias current independent of a voltage held in said each memory cell, voltage at said terminal corresponding uniquely to a voltage held in said each memory cell for said bias current; and comparing said voltage at said terminal with said selected one reference voltage level.

12. The method of claim 9 further comprising:

holding said plurality of bits in a plurality of latches; and selecting one of said reference voltage levels for each memory cell in said plurality of memory cells corresponding to said plurality of bits.

13. The method of claim 12 further comprising:

providing for data memory cells and reference memory cells in said memory cell array; and wherein said selecting step selects one of said reference voltage levels for a data memory cell in said plurality of memory cells corresponding to said plurality of bits, and selecting another one of said reference voltage levels for a reference memory cell in said plurality of memory cells.

14. The method of claim 13 further comprising:

providing voltages from said reference memory cells for reading said data memory cells.

15. The method of claim 9 further comprising:

organizing into M blocks circuits for programming voltages into said memory cell array; and providing that each memory cell of said memory cell array is capable of holding N bits, and wherein said programming step simultaneously programs a voltage in M memory cells corresponding to N bits in each of said M memory cells.

16. The method of claim 15 further comprising:

simultaneously erasing memory cell voltages in all memory cells in a block prior to said programming step.

17. The method of claim 9 further comprising:

erasing voltages in at least said plurality of said memory cells simultaneously prior to said programming step.

18. The method of claim 17 wherein said erasing step comprises:

independently comparing memory cell voltages of said plurality of memory cells with a reference voltage to determine whether said memory cell voltages of said plurality of memory cells are erased.

19. The method of claim 18 wherein said erasing step is independently operative upon a memory cell until said memory cell voltage of said memory cell is erased.

20. An integrated circuit comprising:

an array of memory cells, each memory cell capable of holding a voltage corresponding to a plurality of bits;

reading voltage circuits producing a set of reference voltage levels; and sense amplifier circuits connected to said memory cell array and said reading voltage circuits, said sense amplifier circuits simultaneously reading voltages in a selected plurality of said memory cells with respect to said set of reference voltage levels to determine a corresponding plurality of bits in each of said plurality of memory cells.

21. The integrated circuit of claim 20 wherein said memory cell array comprises data memory cells and reference memory cells, said reading voltage circuits comprise reference memory cells holding said set of reference voltage levels.

22. The integrated circuit of claim 21 further comprising a bias current reference generating a bias current through a terminal of each memory cell of said selected plurality of memory cells, said bias current independent of a plurality of bits stored in said each memory cell, and wherein voltage at said terminal, corresponding uniquely to a plurality of bits stored in said each memory cell for said bias current, is compared with said reference voltage levels.

23. The integrated circuit of claim 20 wherein said sense amplifier circuits independently determines said plurality of bits in each of said plurality of memory cells.

24. The integrated circuit of claim 23 wherein said sense amplifier circuits determine each bit in said plurality of bits by comparing said corresponding voltage in one of said plurality of memory cells with respect to one of said set of reference voltage levels in an ordered sequence.

25. The integrated circuit of claim 24 wherein said memory cell array comprises data memory cells and reference memory cells, said reading voltage circuits comprise reference memory cells holding said set of reference voltage levels.

26. The integrated circuit of claim 24 wherein said ordered sequence comprises a Binary Search Algorithm.

27. The integrated circuit of claim 24 wherein said one of said set of reference voltage levels is determined by previously determined bit in said plurality of bits.

28. The integrated circuit of claim 20 further comprising:

a plurality of latches connected to said sense amplifier circuits, said plurality of latches receiving said corresponding plurality of bits in each of said plurality of memory cells.

29. The integrated circuit of claim 20 wherein said sense amplifier circuits are organized into M blocks and each memory cell of said memory cell array is capable of holding a voltage corresponding to N bits, said sense amplifier circuits connected to simultaneously determine N bits in M memory cells in each of said M memory cells.

30. The integrated circuit of claim 20 wherein said memory cells comprise nonvolatile memory cells.

31. An integrated circuit capable of being programmed M×N input bits at a time, said integrated circuit comprising:

an array of memory cells, each memory cell capable of holding a voltage corresponding to N bits;

voltage generation circuits generating a set of reference voltage levels corresponding to all combinations for N bits;

high voltage circuits connected to said memory cell array and said voltage generation circuits, said high voltage circuits simultaneously and independently programming voltages with respect to said reference voltage levels in a selected M memory cells; and sense amplifier circuits connected to said memory cell array and said voltage generation circuits, said sense amplifier circuits simultaneously reading voltages in said selected M memory cells with respect to said set of reference voltage levels to determine a corresponding N bits in each of said M cells, said high voltage circuits responsive to said sense amplifier circuits operative on each of said M memory cells until a voltage programmed in said memory cell has a predetermined relationship with a selected one reference voltage level and corresponds to N input bits.

32. The integrated circuit of claim 31 wherein said high voltage circuits incrementally program voltage in each memory cell of said M memory cells and said sense amplifier circuits compare a memory cell voltage of said each memory cell with said selected one reference voltage level for said memory cell after each programming increment to determine whether said memory cell voltage of said memory cell has reached said predetermined relationship with said selected one reference voltage level.

33. The integrated circuit of claim 32 further comprising a bias current reference generating a bias current through a terminal of each memory cell of said selected M memory cells, said bias current independent of a voltage held in said each memory cell, and wherein a voltage at said terminal, corresponding uniquely to a voltage held in said each memory cell for said bias current, is compared with said selected one reference voltage level.

* * * * *